United States Patent
Bjarlin et al.

(10) Patent No.: US 9,685,755 B2
(45) Date of Patent: Jun. 20, 2017

(54) LASER SYSTEM WITH WAVELENGTH CONVERTER

(75) Inventors: Ole Jensen Bjarlin, Værløse (DK); Peter Eskil Andersen, Tølløse (DK); Paul Michael Petersen, Hillerød (DK); André Müller, Roskilde (DK)

(73) Assignee: DANMARKS TEKNISKE UNIVERSITET, KGS. Lyngby (DK)

( * ) Notice: Subject to any disclaimer, the term of this patent is extended or adjusted under 35 U.S.C. 154(b) by 56 days.

(21) Appl. No.: 14/384,353

(22) PCT Filed: Mar. 13, 2012

(86) PCT No.: PCT/EP2012/054338
§ 371 (c)(1),
(2), (4) Date: Nov. 10, 2014

(87) PCT Pub. No.: WO2013/135271
PCT Pub. Date: Sep. 19, 2013

(65) Prior Publication Data
US 2015/0092801 A1    Apr. 2, 2015

(51) Int. Cl.
*H01S 5/062* (2006.01)
*H01S 3/137* (2006.01)
(Continued)

(52) U.S. Cl.
CPC .......... *H01S 3/137* (2013.01); *H01S 3/09415* (2013.01); *H01S 5/0265* (2013.01);
(Continued)

(58) Field of Classification Search
CPC .... H01S 3/137; H01S 5/0625–5/06258; H01S 5/068–5/0687; H01S 5/1014
See application file for complete search history.

(56) References Cited

U.S. PATENT DOCUMENTS

| 5,128,948 A |   | 7/1992 | Papuchon |
| 5,175,643 A | * | 12/1992 | Andrews ............... H01S 5/0265 359/339 |

(Continued)

FOREIGN PATENT DOCUMENTS

| CN | 1591154 | 3/2005 |
| DE | 19732758 | 2/1999 |

(Continued)

OTHER PUBLICATIONS

Beam properties of 980 nm tapered lasers with separate contacts—experiments and simulations FBH, Odriozola et al., IEEE J Quantum Electron (2009).

(Continued)

*Primary Examiner* — Joshua King
(74) *Attorney, Agent, or Firm* — Michael Best & Friedrich LLP

(57) ABSTRACT

A method of controlling beam quality and stability of a laser apparatus, the laser apparatus comprising, a diode laser (10) providing first radiation of at least a first wavelength, and a frequency conversion unit (12) configured to frequency-convert the first radiation from the diode laser and to output the frequency-converted radiation (213), the frequency-converted radiation having at least a second wavelength different from the first wavelength, the diode laser (10) comprising at least a first and a second section (222,223), a first contact (220) for injecting a first current ($I_1$) into the first section (222), a second contact (221) for injecting a second current ($I_2$) into the second section (223), and means for controlling a temperature of the diode laser; wherein the method comprises monitoring a first parameter indicative of the power content of a dominant lobe of the first radiation; iteratively determining a combination of respective values of the first current, the second current and the temperature at which combination of respective values the monitored first (Continued)

parameter and a stability parameter indicative of a fluctuation over time of the monitored first parameter each fulfills a respective predetermined optimization criterion; and setting the first current, the second current, and the temperature to the determined combination of respective values.

12 Claims, 10 Drawing Sheets

(51) Int. Cl.
| | |
|---|---|
| H01S 3/0941 | (2006.01) |
| H01S 5/026 | (2006.01) |
| H01S 5/0683 | (2006.01) |
| H01S 5/0687 | (2006.01) |
| H01S 5/068 | (2006.01) |
| H01S 3/131 | (2006.01) |
| H01S 3/16 | (2006.01) |
| H01S 5/00 | (2006.01) |
| H01S 5/06 | (2006.01) |
| H01S 5/10 | (2006.01) |
| H01S 5/125 | (2006.01) |
| H01S 5/22 | (2006.01) |

(52) U.S. Cl.
CPC .......... *H01S 5/0683* (2013.01); *H01S 5/0687* (2013.01); *H01S 5/06804* (2013.01); *H01S 3/1312* (2013.01); *H01S 3/1625* (2013.01); *H01S 3/1636* (2013.01); *H01S 5/0064* (2013.01); *H01S 5/0092* (2013.01); *H01S 5/0617* (2013.01); *H01S 5/0624* (2013.01); *H01S 5/1014* (2013.01); *H01S 5/125* (2013.01); *H01S 5/22* (2013.01); *H01S 2301/02* (2013.01)

(56) References Cited

U.S. PATENT DOCUMENTS

| | | | |
|---|---|---|---|
| 5,218,609 A | 6/1993 | Oda | |
| 5,644,584 A * | 7/1997 | Nam | H01S 5/02248 372/102 |
| 5,715,268 A * | 2/1998 | Lang | H01S 5/026 359/337 |
| 5,796,902 A | 8/1998 | Bhat et al. | |
| 6,130,901 A * | 10/2000 | Takamine | H01S 5/0687 372/22 |
| 6,130,903 A * | 10/2000 | Moloney | H01S 5/50 359/244 |
| 6,287,298 B1 | 9/2001 | Nighan | |
| 7,010,006 B2 * | 3/2006 | Kasazumi | H01S 5/0687 372/22 |
| 2002/0051472 A1 * | 5/2002 | Morthier | H01S 5/06256 372/29.01 |
| 2002/0181519 A1 * | 12/2002 | Vilhelmsson | G01J 9/0246 372/32 |
| 2003/0006382 A1 | 1/2003 | Spath | |
| 2005/0254531 A1 * | 11/2005 | Furukawa | H01S 5/06804 372/22 |
| 2006/0165137 A1 * | 7/2006 | Kachanov | H01S 5/02248 372/21 |
| 2006/0209913 A1 * | 9/2006 | Yokoyama | H01S 5/06256 372/29.011 |
| 2007/0177638 A1 | 8/2007 | Seelert | |
| 2009/0003402 A1 | 1/2009 | Nunen et al. | |
| 2009/0252187 A1 * | 10/2009 | Bauco | H01S 5/06255 372/29.011 |
| 2010/0265980 A1 * | 10/2010 | Matsuda | B82Y 20/00 372/46.01 |
| 2011/0110388 A1 * | 5/2011 | Baroni | H01S 5/10 372/26 |
| 2012/0219024 A1 * | 8/2012 | Okamoto | H01S 5/0687 372/20 |
| 2013/0094528 A1 * | 4/2013 | Ikagawa | H01S 3/10 372/20 |

FOREIGN PATENT DOCUMENTS

| | | |
|---|---|---|
| EP | 1550905 | 7/2005 |
| JP | 2005-070610 | 3/2005 |

OTHER PUBLICATIONS

C. C. Harb et al. Intensity noise dependence of Nd:YAG lasers on their diode-laser pump source (JOSA B, vol. 14, No. 11, Nov. 1997), pp. 2936-2945.
Directly diode laser pumped Ti-Sapphire laser, Opt. Lett, 34, 3334, 2009.
Jensen, Ole Bjarlin, et al: High-power green light generation by second harmonic generation of single-frequence tapered diode lasers, (2011).
Kitaoka Y et al: "Wavelength stabilization of a distrbuted bragg reflector laser diode by use of complementary current injection" Otics Letters, OSA, Optical Society of America, Washington, DC, US. vol. 28, No. 11, Jun. 1, 2003, pp. 914-916.
Lundeman, Jesper H., et al: High power 404 nm source based on second harmonic generation in PPKTP of a tapered external feedback diode laser. Optics Express, vol. 16, No. 4, Feb. 1, 2008, pp. 2486-2493.
Muller A et al_Frequency-doubled DBR-tapered diode laser for direct pumping of Ti-sapphire lasers, Opt Express (2011).
Müller et al: Frequency-doubled diode laser for direct pumping of Ti:sapphire lasers, SPIE (2012).
Ole Jensen et al: "1.5 W green light generation by single-pass second harmonic generation of a single-frequence tapered diode laser" Optics Express, vol. 17, No. 8, Apr. 1, 2009, pp. 6532-6539.
Xingsheng Liu, et al: Wavelenght Matching and Tuning in Green Laser Packaging using Second Harmonic Generation. Electronic Components and Technology Conference 2006, 56th San Diego, NJ, USA, IEEE, May 30, 2006, pp. 1064-1069.
Jedrzejczyk et al; "1 W at 531 nm generated in a ppMgO:LN planar waveguide by means of frequency doubling of a DBR tapered diode laser". Nonlinear Frequency Generation and Conversion: Materials, Devices, and Applications X, Spie, Bellingham WA, USA, vol. 7917, No. 1, Feb. 10, 2011, p. 1-7.
Liu et al; "High-power (1.1W) green (532nm) laser source based on single-pass second harmonic generation on a compact micro-optical bench". Nonlinear Frequency Generation and Conversion: Materials, Devices, and Applications X, Spie, Bellingham WA, USA, vol. 7917, No. 1, Feb. 10, 2011, p. 1-7.
Sumpf et al; "1060 nm DBR tapered lasers with 12 W output power and a nearly diffraction limited beam quality". OPtical Sensing II, vol. 7230, Feb. 5, 2009, p. 72301E-1-72301E-8.
Extended European Search Report for Application No. 16182145.9 dated Dec. 19, 2016 (11 pages).

* cited by examiner

LASER SYSTEM WITH WAVELENGTH CONVERTER

CROSS-REFERENCE TO RELATED APPLICATIONS

This is a U.S. national stage entry of International Patent Application No. PCT/EP2012/054338, filed on Mar. 13, 2012, the entire contents of which are fully incorporated herein by reference.

The present invention relates to a diode laser apparatus generating frequency converted light. In particular the present invention relates to tunable, low-noise, frequency converted diode laser apparatus with high beam quality using high power diode lasers. In particular, the invention relates to a method of controlling such a laser apparatus.

BACKGROUND OF THE INVENTION

Diode lasers output radiation at one frequency or frequency interval, further the diode laser may emit radiation at a further frequency or frequency interval, but that frequency, frequencies or frequency interval may not be the desired frequency interval. For example, when a diode laser is used for pumping another laser, the output of the diode laser apparatus needs to match the acceptance frequency band of the laser to be pumped. Therefore there is a need for providing a system that allows the emitted radiation to be transformed to the desired frequency or frequency interval. The term frequency and wavelength may be interchanged throughout the description using the physical relation between frequency and wavelength. Furthermore, when a laser is used for pumping another laser, the efficiency is partly determined by the beam properties of the incoming pumping beam. Therefore there is a need for optimizing the beam properties of high power diode laser based pumping lasers.

Systems and methods are described in publications such as U.S. Pat. No. 5,644,584 wherein a laser system comprising a distributed Bragg reflector or distributed feedback tunable diode laser coupled to a quasi-phasematched waveguide of optically nonlinear material is disclosed.

In the context of pumping lasers that provide ultra-short pulses, in particular Ti:sapphire lasers, the relatively high cost and complexity of pump sources such as frequency doubled diode pumped solid state (DPSS) lasers is presently limiting the applications of Ti:sapphire lasers to cost-insensitive applications. The availability of smaller and less expensive pump sources is believed to significantly expand the possible applications of the Ti:sapphire laser systems.

Recently the frequency-doubled output of high-power edge emitting diode lasers, in particular distributed Bragg reflector (DBR)-tapered diode lasers, have been suggested as an attractive source for pumping Ti:sapphire lasers. Tapered lasers comprise a ridge waveguide section coupled to an index or gain guided tapered section. The two sections may have separate electrical contacts allowing the injection of respective current drives into the different sections. Direct pumping of Ti:sapphire lasers by high power diode lasers has a number of advantages compared to other known pump sources, such as frequency doubled (DPSS) lasers and optically pumped semiconductor (OPS) lasers. Frequency-doubled DPSS and OPS lasers suitable for pumping Ti:sapphire laser are not inexpensive and up to about 50% of the cost of a Ti:sapphire laser may be attributed the pump laser. The dimensions of the frequency-doubled DPSS laser are also quite large and comparable to the dimensions of the Ti:sapphire laser being pumped. Usually the frequency doubled DPSS laser and the Ti:sapphire laser are operated as separate units and precise alignment is required. This leads to relatively high complexity of the final laser system. The complexity is further enhanced in a laser system including a Ti:sapphire laser oscillator and a Ti:sapphire laser amplifier. Here two frequency-doubled DPSS lasers precisely aligned are required.

The use of diode lasers as pump source for Ti:sapphire lasers was demonstrated in Opt. Lett. 34, 3334, 2009. Here a 1 W 452 nm GaN diode laser was used as pump source providing 19 mW of continuous wave Ti:sapphire laser power. Besides the low power efficiency, increased losses resulted from the short pump wavelength. Conventional high power diode lasers have typically been developed as broad area diode lasers with reduced beam quality in the lateral direction. This reduced beam quality will lower the overlap between the pump beam and the cavity beam of the Ti:sapphire laser and lead to relatively low efficiency. The losses induced from the short wavelength can be omitted by using longer wavelengths in the range 480-600 nm. High power diode lasers are currently not available in this wavelength range. The use of OPS lasers will lead to high conversion efficiency as the OPS laser wavelength can be tailored the absorption band of Ti:sapphire and the OPS laser has good beam quality. The complexity and price of OPS lasers are, however, similar to that of frequency-doubled DPSS lasers and will limit the applications of Ti:sapphire lasers in the same way as frequency doubled DPSS lasers.

The article "Frequency-doubled DBR-tapered diode laser for direct pumping of Ti-sapphire lasers generating sub-20 fs pulses" by André Müller et al., Optics Express, Vol. 19, 12156, 2011, has demonstrated that such a laser system can provide power levels that enable competitive direct optical pumping. The use of diode lasers as direct pump source for Ti:sapphire lasers allows the development of low-cost, ultrafast lasers with high efficiencies and small footprints. It will further be appreciated that frequency-doubled diode laser systems may be applied in a variety of alternative applications, e.g. as light source in a measuring system, display systems, medical and other diagnostic systems, etc.

For many such applications the laser apparatus should fulfil a number of criteria including high stability, high beam quality, and requirements on the generated wavelength. For example, in an ultrafast laser system, e.g. femtosecond Ti:sapphire laser system, variations in the pump power will lead to variations in the obtained spectrum and thus the pulse width. For many applications, it is of paramount importance that the pulse width is constant.

The article "Beam properties of 980-nm Tapered Lasers With Separate Contacts: Experiments and Simulations" by H. Odriozola et al., IEEE Journal of Quantum Electronics, Vol. 45, No. 1, January 2009, suggests that the beam quality of 980-nm lasers with separate current drives for the ridge waveguide and tapered sections may be improved by a stronger pumping of the ridge waveguide section with respect to the tapered section. Unfortunately, this prior art article concludes that the observed improvement, far from being a general rule, depends on the details of the device geometry. Furthermore, nothing is mentioned about the stability of the different properties of the laser.

In order to provide a laser apparatus that can be used in practical applications it would thus be strongly desirable to provide such a laser apparatus that provides a stable, high-power output of high beam quality independently of—or at least less sensitive to—the details of the device geometry.

SUMMARY

According to a first aspect, disclosed herein is a method of controlling beam quality and stability of a laser apparatus, the laser apparatus comprising, a diode laser providing first radiation of at least a first wavelength, and a frequency conversion unit configured to frequency-convert the first radiation from the diode laser and to output the frequency-converted radiation, the frequency-converted radiation having at least a second wavelength different from the first wavelength, the diode laser comprising at least a first and a second section, a first contact for injecting a first current into the first section, a second contact for injecting a second current into the second section, and means for controlling a temperature of the diode laser; wherein the method comprises:

monitoring a first parameter indicative of the power content of the dominant lobe of the first radiation;

iteratively determining a combination of respective values of the first current, the second current and the temperature at which combination of respective values the monitored first parameter and a stability parameter indicative of a fluctuation over time of the monitored first parameter each fulfils a respective predetermined optimization criterion;

and setting the first current, the second current, and the temperature to the determined combination of respective values.

The inventors have realised that the conversion efficiency and the beam quality of the frequency-converted radiation may be improved while at the same time providing a high stability of the frequency-converted radiation, in particular a high stability of the output power of the frequency-converted radiation.

To this end, in a laser apparatus having two, or more, separate contacts for controlling the current to different sections of the diode laser independently, the separate input currents to the diode laser and the temperature of the diode laser are adjusted so as to control at least a parameter indicative of the power content of the dominant lobe of the first radiation.

In particular, the inventors have realised that such a simultaneous improvement of the stability and the beam quality of the resulting beam may be obtained by an iterative adjustment of the combination of the above three control parameters rather than by a simple increase of the pumping of one of the sections, e.g. a ridge waveguide, of the diode laser as suggested in the prior art. Surprisingly the values of the first and second currents that embodiments of the present control method determine to result in an optimal total power and power content of the dominant lobe while at the same time being stable over time are different from those values that were commonly believed in the prior art to result in an optimal beam quality.

Embodiments of the invention are particularly, but not exclusively, advantageous for obtaining a signal having low noise. The invention is further particularly, but not exclusively, advantageous for obtaining a signal having low intensity noise.

One parameter indicative of the beam quality of the output radiation from the diode laser is the so-called $M^2$ value, e.g. measured as defined in the ISO/DIS 11146 standard that defines that $M^2$ should be calculated from a series of measurements by focusing the beam with a fixed position lens of known focal length, and then measuring the characteristics of the beam waist and divergence. In particular, $M^2$ may be measured by measuring the beam width through a focus. The spot size is measured using the second moment values for the beam width. The second moment beam width includes the majority of the power in the beam. High power diode laser beams typically have significant power content in side lobes and thus the second moment beam width is significantly larger than a perfect Gaussian beam and the $M^2$ value is significantly larger than 1. The central lobe of many high power diode laser (at least those that may be classified as having a good beam quality) is nearly perfectly Gaussian in the focus region and thus this part of the beam will propagate close to a beam with $M^2=1$.

In nonlinear frequency conversion like frequency doubling, sum frequency generation, difference frequency generation or optical parametric oscillation, the conversion is most efficient in regions with high intensity. Thus, the high intensity of the dominant lobe of high power diode lasers will be efficiently converted, while the presence of side lobes reduces the conversion efficiency. Therefore, nonlinear frequency conversion will be most efficient for a beam with high dominant lobe power. In a laser apparatus employing high power diode lasers and nonlinear frequency conversion, it is thus important to optimize and stabilize the power content in the dominant lobe. Advantageously, the power content in the dominant lobe can be monitored during operation and stabilized using the injection currents.

Furthermore, when the power in the dominant lobe is optimized, the beam quality of the generated beam is significantly better than the fundamental beam as the low intensity side lobes are not efficiently converted and will be suppressed compared to the dominant lobe.

Accordingly, it has turned out that when the beam quality is measured as the power content of the dominant lobe of the beam waist, e.g. measured as the ratio of the power of the dominant lobe relative to the total output power of the diode laser, an improved beam quality of the frequency-converted radiation is obtained. In particular, the beam profile of the frequency converted light is improved as only the high intensity regions of the fundamental light are efficiently converted.

The dominant lobe of a laser beam having a multi-lobe spatial intensity distribution may be defined as the lobe having a highest intensity. In most situations this is the central or lowest order lobe. However, in some situations, e.g. in some broad-area lasers with external-cavity feedback, the dominant lobe may be a higher-order lobe.

Power content of the dominant lobe may be defined as the power contained within a Gaussian profile with full-width half-maximum (FWHM) or $1/e^2$ beam width equal to the width of the real beam. It may further be defined by the "power in the bucket" definition, i.e. the power that passes an aperture with a specific width. Nevertheless it will be appreciated that embodiments of the control method disclosed herein may be performed based on different measures of the dominant lobe power content.

At the same time, measurement of the power content of the dominant lobe, or at least of a suitable measure of the power content of the dominant lobe, can be performed by simple measurement devices such as a photodiode that can efficiently be included in a relatively low-cost and compact laser apparatus. A suitable measure of the power content of the dominant lobe is a power measurement of the spatially filtered beam, where the spatial filter only allows a predetermined dominant portion of the beam to pass. The spatial filter may be a slit, an optical fiber, or the like onto which the beam is focussed. A suitable measure of the total power content is a power measurement of the unfiltered beam.

In one embodiment, the method may comprise
determining a dominant lobe power content of the first radiation, e.g. by using a spatial filter and a photodiode;
comparing the determined dominant lobe power content to a threshold value,
if the determined dominant lobe power content is below the threshold value, adjusting the first current until the dominant lobe power content is above the threshold value;
if the determined dominant lobe power content is below the threshold value and if the first current is at a lowest or highest current threshold, adjusting the second current.

When the current supplied to the first contact is at the lowest or highest current threshold level and the current to the second contact has been adjusted, the current supplied to the first contact may be raised or lowered again so that the two currents are within a predetermined range.

In another embodiment, the method may comprise
monitoring a dominant lobe power content of the first radiation, e.g. by using a spatial filter and a photodiode;
iteratively adjusting the first current until the dominant lobe power content is at least approximately maximised;
if the determined dominant lobe power content is below a lower threshold value and if the first current is at a lowest or highest current threshold, adjusting the second current.

For the purpose of the present description, the term at least approximately maximised/minimised in respect of a performance parameter is intended to refer to an optimization procedure where a control parameter is adjusted and a resulting change in the performance parameter is monitored until the performance parameter has approached a maximum/minimum within a predetermined margin.

In some embodiments, the method further comprises monitoring a second parameter indicative of a total power of the first radiation; and wherein determining a combination of respective values of the first current, the second current and the temperature comprises determining a combination of respective values of the first current, the second current and the temperature at which combination of respective values the monitored first parameter, the monitored second parameter, and a fluctuation over time of the monitored first parameter each fulfils a respective predetermined optimization criterion. The optimization of the first and second currents and the temperature with respect to both the dominant lobe power content, the total power content and the stability of the dominant lobe content has been found to allow a particularly stable operation of the laser system while at the same time providing good beam properties of the frequency-converted beam. Hence, in this embodiment, the method adjusts the first and second currents and, if necessary, the temperature until respective optimization criteria for each parameter, including the stability parameter, are fulfilled. The predetermined optimization criterion to be fulfilled by the second parameter may comprise the second parameter being above a predetermined threshold.

It has been realised by the inventors that embodiments of the control method disclosed herein, including the choice of parameters to be optimized and the control parameters to adjust, allow an optimized operation of a laser diode system with a frequency converter unit. In particular, embodiments of the method disclosed herein allow for an automatic adjustment process and a process that is less sensitive to details of the specific diode laser.

Noise may arise from several sources. Intensity noise in a laser apparatus occurs due to variations in the lasers power, i.e. the amount of light emitted. The amount of light emitted will vary or fluctuate as a function of time. Other types of noise arise as frequency noise or phase noise, where the frequency or phase of the light emitted will vary slightly. Intensity noise mainly occurs due to variations, or noise, in the current supplied to the laser and from mode-hops, i.e. where the laser will hop from emitting light at one frequency to a neighbouring frequency. Near these mode-hops the laser will be more unstable and therefore noisier. One solution is to emit light in a frequency between such two mode-hop frequencies in order to optimize noise properties of the laser apparatus. The noise that will originate from the current may be lowered by filtering the current that is supplied to the laser.

As a change in temperature alters the wavelength of the laser apparatus, it is normally desirable to avoid the need for adjusting the temperature during the optimization process, in particular, if operation in a predetermined wavelength range is desirable. Accordingly, in some embodiments, iteratively determining a combination of respective values comprises setting the temperature to an initial value; performing an inner control loop during which only the first and second currents are adjusted, and only if the respective optimizing criteria cannot all be fulfilled by only adjusting the first and second currents within respective predetermined current intervals, adjusting the temperature and repeating the inner loop with the temperature set to the adjusted value.

In some embodiments, the method further comprises:
if the determined stability parameter exceeds a predetermined threshold, determining whether the second current is below a predetermined threshold current;
if the second current is above a predetermined threshold current, adjusting the temperature to a modified temperature setting; otherwise modifying the optimization criterion to be fulfilled by the second parameter;
adjusting the first current and the second current until the first and second parameters each fulfil a respective optimization criterion. Hence the current and temperature settings are adjusted so as to avoid settings that result in unstable operation.

Due to the high efficiency of near infrared diode lasers and the highly localized heat source, it is possible to efficiently cool the laser apparatus by purely passive means while maintaining the high degree of power stability required from the final laser system. Furthermore, the temperature of the diode laser may be controlled in a variety of ways, such as using thermoelectric element and a standard PID temperature control. Optionally, the temperature may also be monitored by the control loop. However, it has turned out that the temperature does not have to be at a specific value, as long as it is stable and can be increased or decreased.

In one embodiment, the method further comprises:
determining an intensity noise level of the first radiation, e.g. measured as an amount of fluctuation of the output power over time, e.g. by using a photodiode;
comparing the determined noise level to a threshold value;
if the determined intensity noise level is above the threshold value, adjusting the current supplied to at least one of the contacts, e.g. a first contact, and/or the temperature of the diode laser until the noise level is below the threshold value.

Hence, embodiments of the method ensure a reduction of the intensity noise level of the radiation of the diode laser, thus improving the stability of the frequency-converted radiation.

In some embodiments, the predetermined optimization criterion to be fulfilled by the first parameter comprises the first parameter being at least approximately optimized, e.g. maximised, and above a predetermined threshold; and wherein the predetermined optimization criterion to be fulfilled by the stability parameter comprises a fluctuation over time of the first parameter being below a predetermined threshold For example, the first parameter may repeatedly be compared to its threshold value, e.g. a number of times per second, and a variance of the deviations may be determined as a measure of the fluctuation. For example, the threshold fluctuation may be chosen to be between 0.1% and 5% of the threshold value for the first parameter. Hence the predetermined optimization criterion to be fulfilled by the stability parameter may be a measure of the intensity noise associated with the dominant lobe power content.

The spectral line width of high power diode lasers depend on many factors, such as e.g. the geometry of the diode laser, the reflectivity of the diode laser facets, the overlap between the active region and the optical waveguide, the use of internal or external wavelength selective components (e.g. gratings or prisms), the temperature of the diode laser and the injection current to the diode laser. Embodiments of the control method disclosed herein result in stable operation of the diode laser at an operation point remote from mode hops of the diode laser. Consequently, the laser operates with a narrow line width and mode hops are avoided.

In some embodiments, determining the combination of respective values comprises:

a) setting the temperature to an initial value;
b) monitoring the second parameter and adjusting the second current until the second parameter is equal or larger than a first threshold value;
c) monitoring the first parameter and adjusting the first current so as to increase the first parameter, preferably so as to at least approximately maximise the first parameter;
d) comparing the first parameter with a second threshold value;
e) if the first parameter is smaller than the second threshold level comparing the second current with a threshold current;
   if the second current is smaller than the threshold current increasing the first threshold value and repeating steps b) through d); otherwise
   decreasing the temperature and repeating steps b) through d);
f) if the first parameter is larger than the second threshold, monitoring the first parameter and determining a level of fluctuation of the first parameter over time; and if the determined fluctuation is larger than a third threshold, repeating step e).

At least some embodiments of the method disclosed herein may be implemented by a control circuit of a laser apparatus and allow automatic control of the laser apparatus. For example, the control circuit may be configured to perform an embodiment of the control method described herein upon start-up of the laser apparatus, periodically, continuously, and/or at any other suitable points in time.

In some embodiments, the diode laser is a tapered diode laser wherein the first section is a ridge waveguide and the second section a tapered section. In alternative embodiments, the diode laser is a different type of diode laser having at least two sections, such as a broad area laser, a master oscillator power amplifier (MOPA), a α-DFB laser or similar lasers. Diode lasers having a well-defined dominant lobe and high output power, e.g. tapered diode lasers, are particularly well-suited in connection with embodiments of the control method disclosed herein.

The present invention relates to different aspects including the method described above and in the following, a laser apparatus, and corresponding methods, devices, and/or product means, each yielding one or more of the benefits and advantages described in connection with the first mentioned aspect, and each having one or more embodiments corresponding to the embodiments described in connection with the first mentioned aspect and/or disclosed in the appended claims.

According to one aspect, disclosed herein is a laser apparatus comprising:

a diode laser providing first radiation of at least a first wavelength, the diode laser comprising a first and a second section, a first contact for injecting a first current into the first section, a second contact for injecting a second current into the second section, and means for controlling a temperature of the diode laser; and a frequency conversion unit configured to frequency-convert the radiation from the diode laser and to output the frequency-converted radiation, the frequency-converted radiation having at least a second wavelength different from the first wavelength;

a first sensor configured to measure a first parameter indicative of power content of a dominant lobe of the first radiation;

a control circuit configured to determine a combination of respective values of the first current, the second current and the temperature at which combination of respective values the monitored first parameter and a stability parameter indicative of a fluctuation over time of the monitored first parameter each fulfils a respective predetermined optimization criterion; and to set the first current, the second current, and the temperature to the determined combination of respective values.

In an embodiment the diode laser provides radiation in a single-frequency output. Some diode lasers may provide radiation output at multiple frequencies, but single-frequency outputs are preferred. If the diode laser outputs radiation of a first wavelength interval the second wavelength interval output by the frequency conversion unit may have one end point outside the first wavelength interval. In some embodiments the diode laser generates radiation in the near-infrared region, e.g. in the 800-1200 nm wavelength range. The diode laser may provide an output of more than 1 watt. The diode laser may provide any power level such as 2 watt, 3 watt, 4 watt, 5 watt or any other suitable value.

The frequency-conversion unit may be a frequency doubler, e.g. performing second harmonic generation (SHG), difference frequency generation (DFG), or sum frequency generation (SFG) or a combination of these or an optical parametric oscillator (OPO). In an embodiment the frequency conversion unit generates radiation by sum frequency mixing of the radiation in the first spectral region. This may also be useful when combining two or more beams.

Examples of frequency converters include a non-linear optical material allowing a conversion of the frequency of the signal, either up or down. The conversion may be a frequency doubling, but other factors may be implemented, such as frequency conversion by 0.5, 2.0, 2.5 or the like. Any other conversion than frequency doubling may e.g. be performed using sum or difference frequency generation. In specific embodiments the non-linear optical material may be a periodically poled crystal and/or a birefringent crystal and/or a waveguide and/or a photonic crystal and/or non-linear fibre or any combinations thereof. The frequency conversion unit may comprise a nonlinear material such as crystal materials lacking inversion symmetry. The crystal may be a bulk crystal or a waveguide. In an embodiment the frequency conversion unit includes an external resonant cavity wherein the non-linear material is positioned.

The frequency converted radiation may be in the wavelength range 300 nm to 600 nm, such as 330 nm to 550 nm, such as 400 nm to 450 nm, such as 300 nm to 330 nm, such as 330 nm to 400 nm, such as 400 nm to 450 nm, such as 450 nm to 500 nm, such as 500 nm to 550 nm, such as 550 nm to 600 nm. Alternatively, the frequency converted radiation may be in the wavelength range 1500 nm to 6000 nm, such as 1500 nm to 2000 nm, such as 2000 nm to 2500 nm, such as 2500 nm to 3000 nm, such as 3000 nm to 3500 nm, such as 3500 nm to 4000 nm, such as 4000 nm to 4500 nm, such as 4500 nm to 5000 nm, such as 5000 to 5500 nm, such as 5500 nm to 6000 nm, such as 1700 nm to 5700 nm, such as 2000 nm to 5000 nm, such as 3000 nm to 4000 nm.

In some embodiments, the laser apparatus comprises a spatial filer, such as a slit, an optical fiber, and/or the like, configured to spatially filter at least a portion of the first radiation; and the first sensor, e.g. a photodiode, a detector array, or another suitable detector for detecting a power of a light beam, is configured to detect the spatially filtered portion of the first radiation. To this end, the laser apparatus may comprise an optical device arranged in the beam path between the diode laser and the frequency conversion unit and adapted to direct a portion of the first radiation towards the first sensor. The optical device may be a beam splitter, a mirror allowing a small portion of the incident light to be transmitted while the major part of the incident light is reflected, or any other device suitable for separating a minor portion of the first radiation from the major portion. The spatial filtering may be performed on the entire first radiation, e.g. by inserting a focussing lens and a slit or an optical fiber in the beam path. Alternatively, the spatial filtering may be performed only on a portion of the first radiation directed towards the first sensor.

In some embodiments, the laser apparatus comprises a second sensor configured to measure a second parameter indicative of the total power of the first radiation. For example, the laser apparatus may comprise an optical device, e.g. a beam splitter or mirror, arranged in the beam path between the diode laser and the frequency conversion unit and adapted to direct a portion of the first radiation towards the second sensor. The second sensor may be a photodiode or a detector array, or any other suitable detector for detecting a power of a light beam. Accordingly, the control unit may be adapted to determine a combination of respective values of the first current, the second current and the temperature at which combination of respective values the monitored first parameter, the monitored second parameter, and a fluctuation over time of the monitored first parameter each fulfils a respective predetermined optimization criterion.

In some embodiments, the laser apparatus comprises a third sensor adapted to detect the power of the frequency-converted radiation. The third sensor may be a photodiode or a detector array, or any other suitable detector for detecting a power of a light beam. For example, the laser apparatus may comprise an optical device, e.g. a beam splitter or mirror, arranged in the beam path of the frequency-converted radiation and adapted to direct a portion of the frequency-converted radiation towards the third sensor. In some embodiments the method further comprises monitoring the power of the frequency-converted radiation, and adjusting the temperature of the frequency conversion unit so as to increase or even maximise the efficiency of the frequency conversion process by phase matching. To this end, the nonlinear crystal may be placed in an oven and the temperature may be adjusted using a PID control loop.

In some embodiments, the method further comprises determining whether the monitored power of the frequency conversion unit after the adjustment of the temperature of the frequency conversion unit is above a predetermined threshold power; and if the optimized monitored power is below the threshold power, repeating the step of iteratively determining the combination of respective values of the first and second currents and of the temperature of the diode laser, e.g. at step d) of the embodiment described above. In some embodiments, the method comprises adjusting the temperature of the diode laser by a small amount, e.g. using a step size between 0.01 K and 0.1 K or another suitable step size, before repeating the step of iteratively determining the combination respective values.

In some embodiments the laser apparatus comprises a dispersive element, such as a grating, a prism, and/or the like, configured to receive a portion of the first radiation and to direct respective wavelength components of the received portion of the first radiation into different directions; and a fourth sensor configured to detect a predetermined wavelength component. Embodiments of the control method may thus comprise monitoring a power content of at least the detected wavelength component and to adjust the temperature of the diode laser so as to increase, e.g. optimize, the monitored power content, thus providing a laser apparatus having a high spectral stability. In particular, some embodiments of the method disclosed herein comprise monitoring a third parameter indicative of a power of the first radiation within a predetermined wavelength interval; and wherein determining a combination of respective values of the first current, the second current and the temperature comprises determining a combination of respective values of the first current, the second current and the temperature at which combination of respective values the monitored first parameter, the monitored second parameter, the monitored third parameter, and a fluctuation over time of the monitored first parameter each fulfils a respective predetermined optimization criterion.

High-power, visible, laser sources are used for a wide range of applications including pumping of other laser sources, spectroscopy applications, display applications and medical applications, including diagnostics and treatment of diseases e.g. by photo-coagulation of blood vessels in the retina and treatment of vascular lesions.

In particular, a further aspect of the present invention provides a method of optically pumping a target laser in a laser apparatus, the laser apparatus comprising a laser source providing first radiation at a first frequency, the laser source being optically connected to an input of a frequency converter, the frequency converter being configured to convert the first radiation at the first frequency to a second, different frequency, the target laser being arranged in optical communication with an output of the frequency converter. The method comprises the steps of emitting radiation from the laser source, receiving the radiation at the frequency converter, converting the radiation from the first frequency to the second frequency in the frequency converter, providing the radiation at the second frequency at the target laser so that the target laser is optically pumped, and wherein the laser source is controlled by performing the steps of the control method disclosed herein. Accordingly, embodiments of the laser apparatus disclosed herein may comprise a target laser configured to receive the frequency-converted radiation. In particular, the frequency-converted radiation may lie within an acceptance bandwidth of the target laser.

The target laser may be a Ti:sapphire laser that may be optically pumped to generate ultra-short pulses, or another suitable laser, such as a dye laser or Cr:colquiriite (Cr:LiSAF, Cr:LiCAF or Cr:LiSGaF) lasers. For the generation of ultrashort laser pulses having a duration of less than about 100 femtoseconds (fs), titanium-doped sapphire, Ti:sapphire, is a very suitable laser material. Ti:sapphire has a wide gain bandwidth extending over the spectral range 700-900 nm. The absorption band of Ti:sapphire is also relatively wide with a bandwidth extending over the spectral range 460-600 nm with the absorption peak being at a wavelength of approximately 490 nm.

BRIEF DESCRIPTION OF THE FIGURES

The systems and methods according to embodiments of the invention will now be described in more detail with regard to the accompanying figures. The figures show one way of implementing the present invention and are not to be construed as being intended to exclude other possible embodiments falling within the scope of the attached claim set. Throughout the drawings, like reference numerals refer to like or corresponding components, elements, and features.

DETAILED DESCRIPTION

Figure 1:
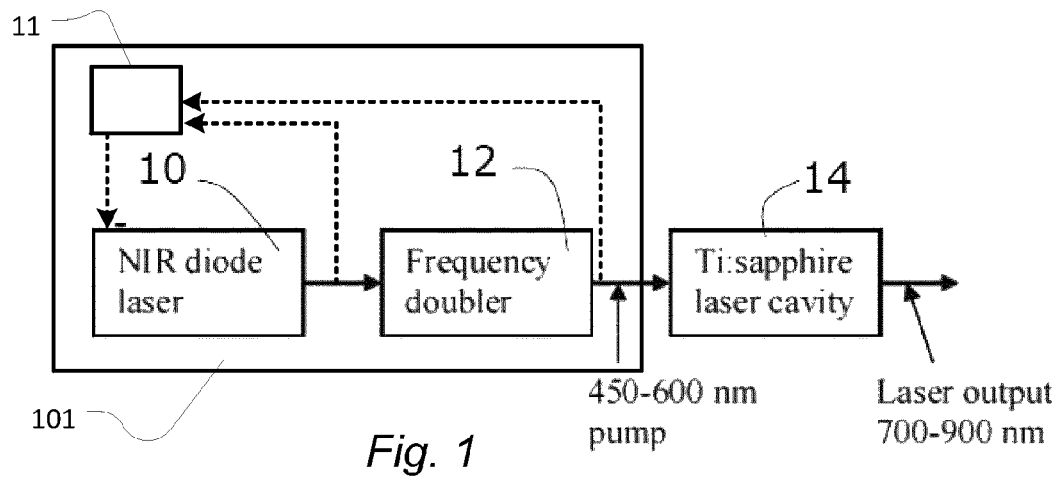
FIG. 1 shows a block-diagrammatical illustration of frequency doubled diode laser pumped Ti:sapphire laser.

FIG. 1 shows a block-diagrammatical illustration of frequency doubled diode laser pumping a Ti:sapphire laser. In particular, FIG. 1 schematically illustrates a laser apparatus 101 comprising a diode laser 10 providing radiation in a first wavelength interval. The apparatus comprises a frequency conversion unit 12 having an input and an output. The radiation converter unit 12 is configured to receive the radiation in the first wavelength interval from the diode laser 10 at the input. The frequency conversion unit 12 is configured to convert the radiation in the first wavelength interval to radiation in a second wavelength interval and the output is configured to output the converted radiation, the second wavelength interval having one end point outside the first wavelength interval. A small part of the optical signal may be extracted before the frequency converter, e.g. by using an optical splitter, and this optical signal may then be used for monitoring and controlling the operation of the system as described herein, e.g. determining optical effect, intensity noise properties, and/or as a reference beam or signal. Similarly, a small part of the optical signal may be extracted after the frequency converter, e.g. by using an optical splitter, and this optical signal may then be used for monitoring and controlling the operation of the system, e.g. determining optical effect, noise properties, and/or as a reference beam or signal.

The output of the converter unit 12 is optically coupled to a laser cavity 14. The laser cavity is preferably a Ti:sapphire laser cavity. In a presently preferred embodiment the frequency-converted beam includes near-infrared radiation; however, this may depend on the type of laser chosen for the radiation source.

The diode laser 10 may have two or more electrical contacts for injecting respective injection currents. This allows easy control of the injection currents and ensures safe contact to the diode laser. The active control of the separate injection currents described herein may thus be performed using two separate contacts for controlling the current to different sections of the diode laser independently. If more than two contacts are present the active control of the injection current may be performed using only two of the separate contacts to operate the laser in a desired regime. To this end, the apparatus 101 comprises a control unit 11 controlling the injection currents and the temperature of the diode laser 10 and optionally the temperature of the frequency conversion unit 12. To this end, the control unit receives inputs indicative of parameters of the output from the diode laser 10 and/or the output from the frequency conversion unit 12. The control unit then performs a control method, e.g. a control loop, an embodiment of which will be described in more detail below with reference to FIG. 3. The control unit may be implemented as a programmable microprocessor and/or any other suitable processing unit implemented by hardware and/or software. It may be integrated into a housing together with the remaining components of the laser apparatus or implemented as a separate unit.

The frequency conversion unit 12 may be constructed in several ways; in one embodiment the frequency conversion unit includes a non-linear optical material.

Embodiments of a laser apparatus, e.g. a laser apparatus 101 suitable for pumping a Ti:sapphire laser and/or for other applications will now be described in more detail. In particular, embodiments of a control method and system for controlling such a laser apparatus and for stabilizing its output will be described.

Figure 14:
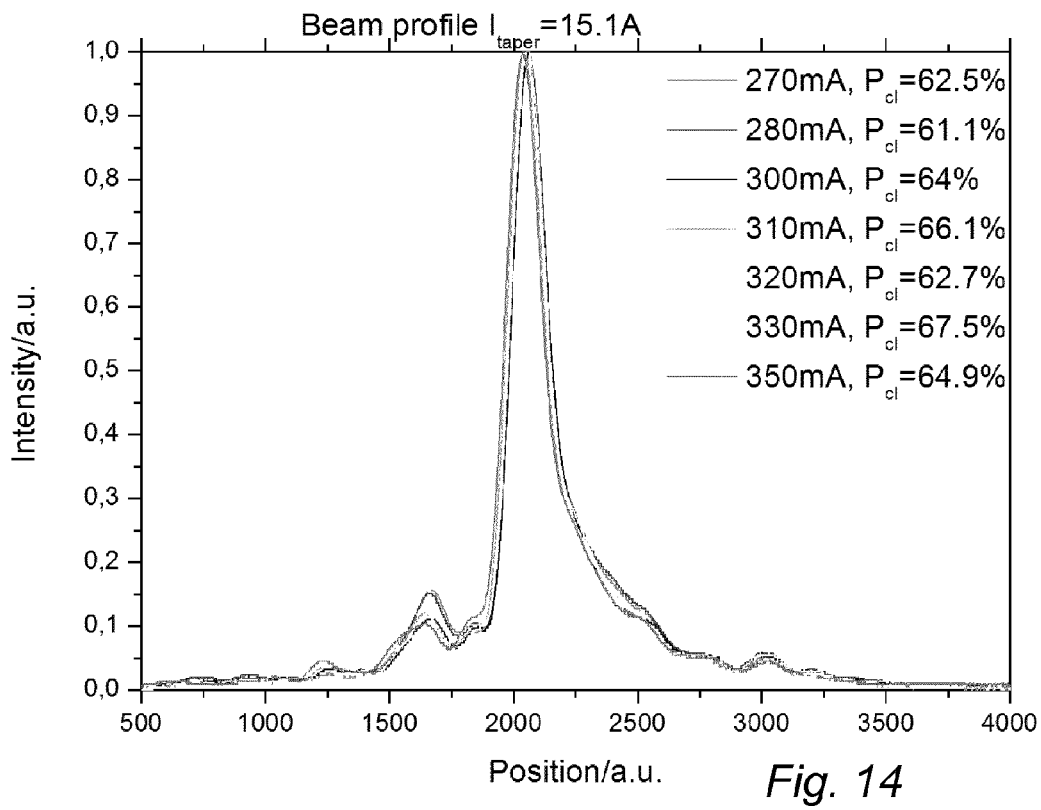
FIGS. 14-15 show beam profiles of a diode laser of an embodiment of a laser apparatus described herein at different injection currents.
Figure 15:
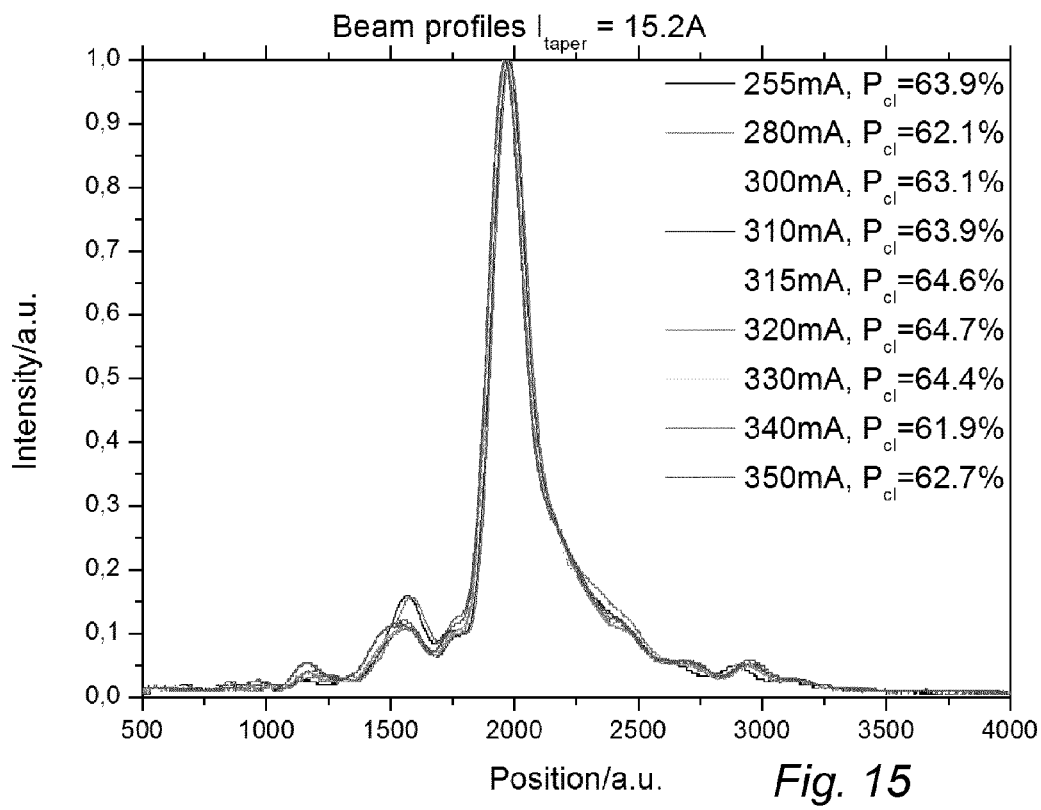

Generally, when aligning a laser system, e.g. a laser apparatus 101 described in FIG. 1, a power meter may be used to measure the power, a beam analyzer may be used to image the beam profile and an optical spectrum analyzer may be used to monitor the wavelength of the laser. When optimizing the injection current settings, all three parameters, power, beam profile and wavelength may be monitored. Examples of beam profiles measured by a beam analyzer are shown in FIG. 14-15 at different injection currents. As is apparent from the beam profiles of FIGS. 14-15, the size of the side lobes varies considerably depending on the injection current. Using these beam profiles in combination with a measurement of the power and the wavelength it has turned out that it is possible to find an optimum operation point. In particular, by individually adjusting the injection currents to the respective contacts of the diode laser and the temperature of the diode laser, it has turned out that an optimal operation point may be selected.

In many applications it may, however, not always be practical to incorporate a beam analyzer, power meter and optical spectrum analyzer in a compact laser system due to the size and cost of these components. It has turned out that for a compact laser system to operate under optimal conditions, the above measurement devices can be replaced by very simple and compact detector systems. In the following embodiments, laser apparatus are described that allow an optimization of both the power and the beam profile of the high power diode laser in an efficient way. The wavelength of the laser may be monitored using other embodiments. In most cases, the wavelength is determined mainly by the temperature of the diode laser.

Figure 2:
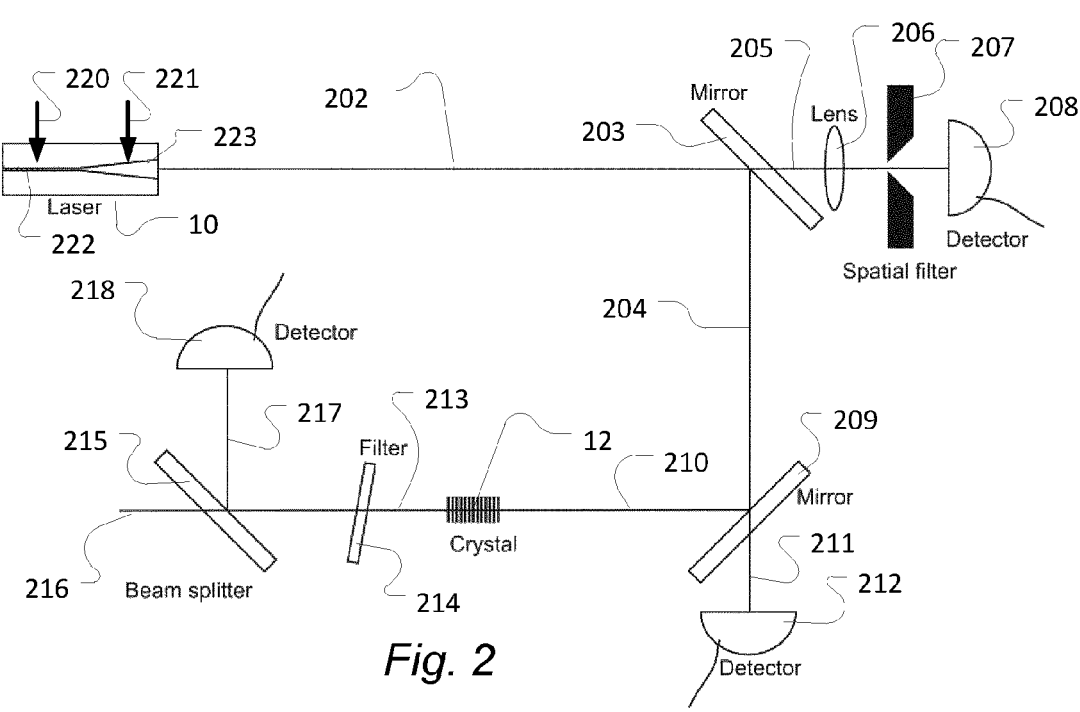
FIG. 2 shows a schematic illustration of an embodiment of a laser apparatus.

FIG. 2 shows a schematic illustration of an embodiment of a laser apparatus. The laser apparatus comprises a laser source 10, e.g. a tapered diode laser comprising a ridge waveguide section 222 and a tapered amplifier section 223. The laser source 10 is controllable by two injection currents 220 and 221, also referred to as ridge and tapered currents, respectively. In this embodiment, the laser source 10 is a tapered diode laser operating at 1062 nm with an embedded DBR grating. The diode laser 10 is equipped with two electrical contacts 220 and 221 to control the current supplied to the ridge waveguide section 222 and the tapered amplifier section 223 individually. The tapered diode laser is capable of emitting more than 10 W laser light in a narrow wavelength region around 1062 nm. The laser source 10 is used for frequency doubling, in the present example to generate green light. To this end, the laser apparatus comprises a nonlinear crystal 12 operating as a frequency doubler and two mirrors 203 and 209, respectively, adapted to direct the output beam 202 from the tapered diode laser 10 to the nonlinear crystal 12. The mirrors 203 and 209 are configured to be highly reflecting at the wavelength of the laser light 202, in this example at 1062 nm. The two mirrors are used to bend the beam path and to allow access for measuring the power of the output of the diode laser 10 by detectors 208 and 212, respectively, as each of the mirrors allows a minor portion 205 and 211, respectively, of the incident light to be transmitted while the major portion 204 and 210, respectively, of the incident light is reflected. The nonlinear crystal 12 is arranged to perform phase matching for frequency doubling of the 1062 nm light into 531 nm light. The laser apparatus further comprises a filter 214 inserted in the beam path after the nonlinear crystal to separate the generated light at 531 nm from the residual non-converted 1062 nm light. A beam splitter 215 with high transmittance at 531 nm is inserted to pick a small amount of green light 217 for monitoring the properties of the green light on a detector 218. The main part of the generated 531 nm light 216 is allowed to exit the laser system as usable light for applications.

After the first highly reflecting bending mirror 203, a lens 206 and a spatial filter 207 are arranged to only allow the central lobe of the 1062 nm light 205 to pass and be incident on detector 208. At detector 208, the power in the central lobe of the 1062 nm laser beam can thus be monitored. For example, during an initial setup of the laser apparatus, the size and position of the aperture of spatial filter 207 may be adjusted while monitoring the beam profile of the beam behind the aperture. The size of the aperture may e.g. be selected sufficiently small so as to suppress substantially all side lobes, but sufficiently large so that a major portion of the dominant lobe passes the spatial filter. When the slit is selected too narrow, this may be detected by observing interference patterns in the filtered beam. The slit may thus generally be adjusted such that the power detected by detector 208 provides a reasonably accurate measure of the power content of the dominant mode of the laser beam.

Detector 212 is positioned after mirror 209 so as to receive a small amount 211 of the light beam 204 reflected from the first mirror 203. Detector 212 thus monitors the total power emitted by the laser 10. By calculating the fraction of power in the central lobe to the total power, the percentage of power in the central lobe can be found. By adjusting the current 220 to the ridge section, it is possible to find a ridge section current which optimizes the percentage of power in the central lobe. It has been found that the wavelength of the laser is mainly determined by the temperature of the laser 10 and the frequency doubling is optimized by adjusting the temperature of the nonlinear crystal 12.

Generally, during initial alignment of the laser system parameters, it may be advantageous to imply a small periodic variation on the taper section current in order to find an optimum operation point that minimize power fluctuations. In the final implementation when the laser system is running this could still be implemented but for certain applications the modulation may induce a small power variation giving rise to excess noise in a measurement.

Figure 3:
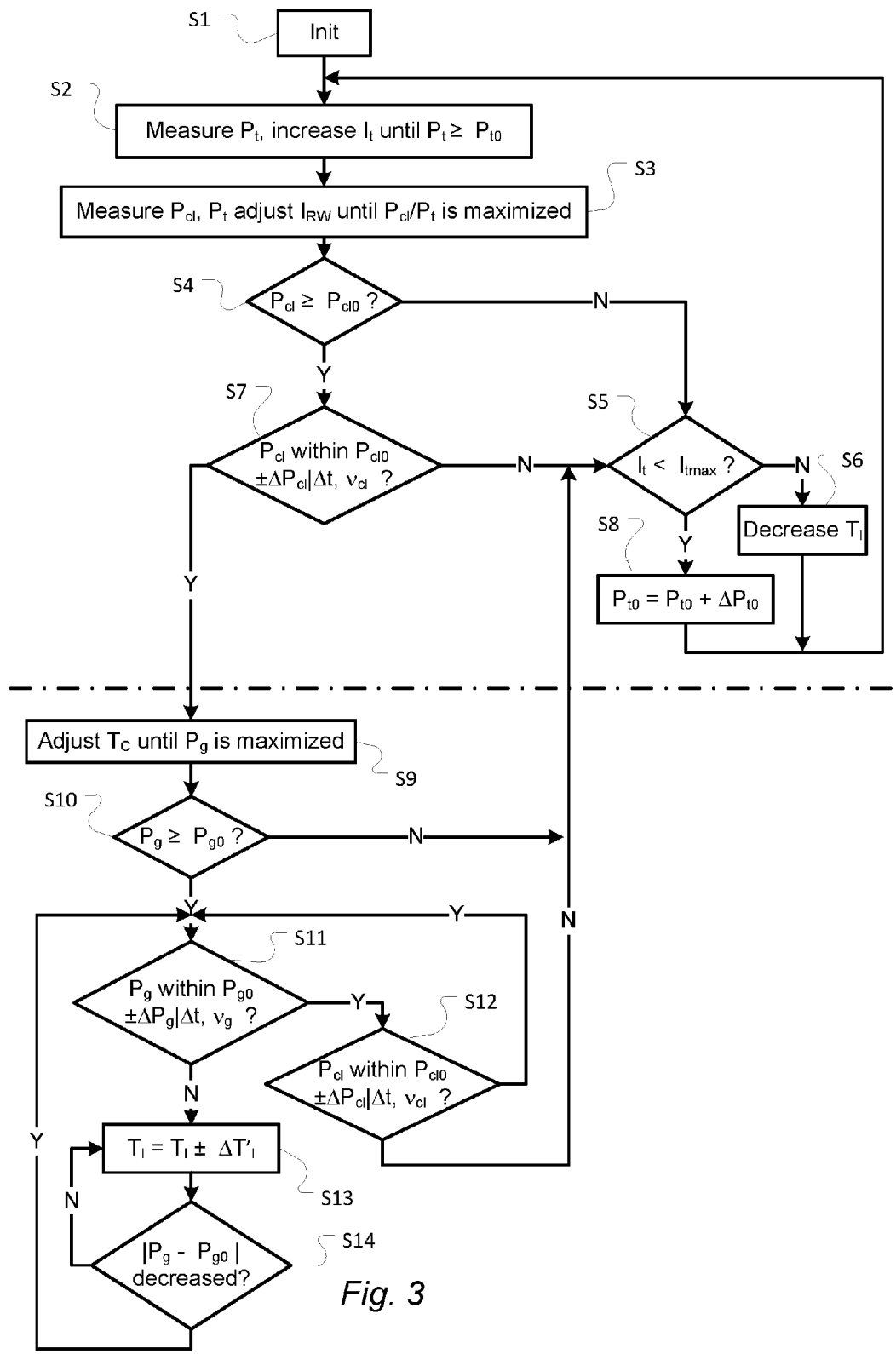
FIG. 3 shows an embodiment of a method for controlling a laser apparatus.

FIG. 3 shows an embodiment of a process for controlling a laser apparatus. The process may e.g. be implemented by a control unit of or connected to a laser apparatus as disclosed herein, e.g. control unit 11 shown in FIG. 1.

Generally, embodiments of the control process may comprise two control loops. A first control loop adjusts the control parameters of the diode laser, namely the currents to the tapered and the ridge section, and the temperature of the laser, so as to determine a combination of these values at which the power of the central lobe is stable, the relative power in the central lobe is at least approximately at a local maximum, and the total power and the power content of the central lobe are above respective threshold values. In a second control loop, the temperature of the frequency converter is adjusted, so as to optimize the efficiency of the frequency conversion process. In the embodiment of FIG. 3, a dashed-dotted line indicates the separation of the process in two control loops.

The process starts with an initialisation step S1, where a number of process parameters are set to their initial values. In particular the following parameters may be set to respective initial values during the initialisation step:

A desired power $P_{g0}$ in the frequency-converted beam.
An acceptable power fluctuation $\Delta P_g$ of the frequency converted beam, e.g. as measured over a predetermined time interval and in a predetermined bandwidth $v_g$.
The bandwidth $v_g$ in Hz at which the power fluctuation $\Delta P_g$ is monitored.
Temperature limits of an acceptable temperature interval for the frequency conversion material.
A desired central lobe power $P_{cl0}$.
An acceptable power fluctuation $\Delta P_{cl}$ of the central lobe power, e.g. as measured over a predetermined time interval and in a predetermined bandwidth $v_{cl}$.
The bandwidth $v_{cl}$ in Hz at which the power fluctuation $\Delta P_{cl}$ is monitored.
An initial value of the desired total power value $P_{t,0}$ of the output beam of the laser diode.
An acceptable interval $[I_{tmin}, I_{tmax}]$ for the taper section current $I_t$.
An acceptable interval $[I_{RWmin}, I_{Rwmax}]$ for the ridge section current $I_{RW}$.
An acceptable interval $[T_{lmin}, T_{lmax}]$ for the laser temperature Tl.

An initial value for the laser temperature $T_{l0}$).
An initial value for the ridge section current $I_{RW}$.
An initial taper section current $I_t$.
An initial ridge section current $I_{RW}$.

In subsequent step S2, the process receives the measured total power $P_t$, e.g. from detector 212, and increases the tapered current $I_t$ until the total power reaches or exceeds $P_{t,0}$.

In subsequent step S3, the process receives the measured power in the central lobe ($P_{cl}$), e.g. from detector 208, and adjusts the ridge section current $I_{RW}$, e.g. within an interval of acceptable ridge section currents, until the ratio $P_{cl}/P_t$ is at least approximately maximized.

In subsequent step S4, the process receives the measured power in the central lobe $P_{cl}$, e.g. from detector 208, and compares the measured value to the target value for the central lobe power $P_{cl0}$. For the example, the threshold $P_{cl0}$ for the dominant lobe power content may be at least 50% of target value for the total power $P_{t0}$, for example, at least 70%, e.g. at least 80%, e.g. at least 90% of $P_{t0}$. If $P_{cl}$ is equal to or exceeds $P_{cl0}$, the process proceeds at step S7; otherwise the process proceeds at step S5.

In step S5, the process compares the taper section current $I_t$ to the interval boundaries of the taper section current. If the current is below the maximum limit $I_{tmax}$, the process increases the target total power $P_{t,0}$ by a predetermined amount $\Delta P_{t0}$ (step S8) and returns to step S2. If the current is at the maximum $I_{tmax}$, the process proceeds at step S6. When the process reaches step S8, the current to the tapered section has not yet reached its maximum value, but the central lobe power may be less than the desired value $P_{cl0}$. This situation typically occurs when the total power is too small, and therefore the target value for the total power is increased in step 8. When the total power is increased, only a relatively smaller portion of the power needs to be in the central lobe for the central lobe power to reach the target value $P_{cl0}$. The step size for adjusting the target value of the total power may be in the range of a few to a few hundred mW or any other suitable step size.

In step S6, the process decreases the laser temperature $T_l$ by a predetermined amount, sets $P_{t,0}$ to its initial value, and returns to step S2. It will be appreciated that the temperature control may not need to monitor the actual temperature and increase the temperature by a specific temperature interval. In some embodiments it may be sufficient to change a control signal, e.g. a control current, controlling a heating and/or cooling device. The laser temperature may be adjusted by any suitable step size, e.g. between 0.5 K to 1 K.

In step S7, the process determines the stability of the output of the diode laser by monitoring $P_{cl}$ (e.g. as measured by detector 208) and by determining the power deviation/fluctuation of $P_{cl}$ around $P_{cl0}$ (or around its average value, if the actual average value is larger than $P_{cl0}$) within a predetermined time interval, e.g. several seconds or a different suitable time interval. For example, the fluctuation of $P_{cl}$ may be measured by a photodiode, e.g. detector 208 of the above figures, adapted to measure the power of the incident laser beam. The photodiode may measure the power with a suitable bandwidth $v_{cl}$, e.g. 1 kHz, which determines the frequency of fluctuations that are to be considered for the purpose of controlling the laser. The time interval and the bandwidth may be selected depending on the application of the laser apparatus. Time intervals ranging between less than 1 s and larger than 1 min may be used, as well as bandwidths ranging from a few Hz or less to many kHz. For many applications, fluctuations less that 10%, e.g. less than 5%, e.g. less than 2%, e.g. less than 1%, e.g. less than 0.1%, such as between 0.1% and 1% may be acceptable. If $P_{cl}$ is stable, e.g. if the power fluctuation of $P_{cl}$ is smaller than a predetermined threshold, the laser has been set and the resulting beam is suitable for frequency conversion.

Nevertheless it may be beneficial to further optimize the frequency-converted output by performing a second control loop which may be performed by the same or a different control unit; accordingly, the process proceeds to step S9. If $P_{cl}$ is not stable to within the predetermined limits and within the time interval, the process returns to step S5.

The second control loop for frequency conversion starts at step S9 where the process adjusts the temperature $T_c$ of the nonlinear crystal so as to obtain a maximum power of the frequency-converted light. To this end, the process may monitor the power $P_g$ of the frequency-converted beam, e.g. by sensor 218.

In subsequent step S10, the process compares the measured frequency-converted power to a corresponding target value $P_{g0}$. If $P_g$ is lower than $P_{g0}$, the process returns to step S5 of the initial control loop. If $P_g$ is equal to or larger than $P_{g0}$, the process proceeds to step S11.

In step S11, the process monitors the frequency-converted power $P_g$. If $P_g$ is within the desired range$\pm\Delta P_g$ around the target value or around the average value of $P_g$, the process proceeds at step S12. If it is outside the range, $P_{g0}\pm\Delta P_g$, the process proceeds at step S13. The fluctuation of $P_g$ may be measured in a similar fashion as described above in connection with $P_{cl}$.

At step S13, the process performs slight adjustment of predetermined size to the laser temperature $T_l$ and measures (step S14) the frequency-converted power. During this step, the step size for the adjustment of the temperature is typically smaller than the adjustments of temperature in the first loop, e.g. the range 0.01 to 0.1 K. If the deviation from the range $P_{g0}\pm\Delta P_g$ increases, the process returns to S13 and adjusts the temperature in the opposite direction by the predetermined step, until the power is in the range $P_{g0}\pm\Delta P_g$. The process then returns to S11.

In step S12, the process performs another stability check of $P_{cl}$, as described in connection with step S7 above, so as to verify that the laser still operates in a stable regime. If $P_{cl}$ is stable, the process may proceed to step S11 to continue monitoring the stability of the laser; alternatively, the process may terminate. If $P_{cl}$ is not stable, the process returns to step S5 of the previous loop so as to re-optimize the laser settings.

Figure 4:
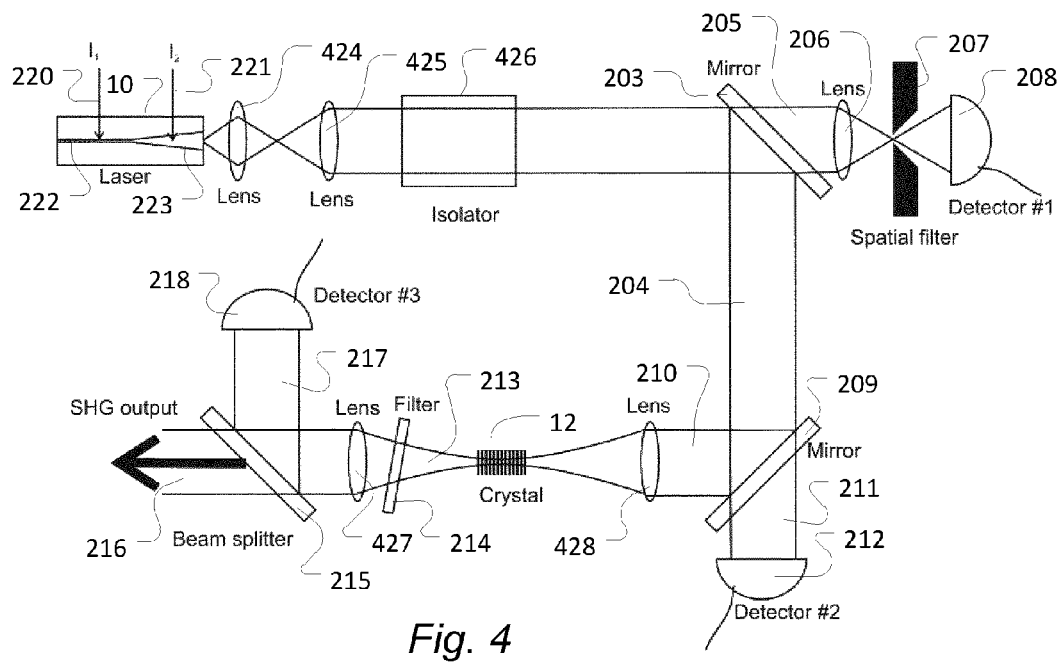
FIGS. 4-11 show schematic illustrations of further embodiments of a laser apparatus.

FIG. 4 shows schematic illustrations of a further embodiment of a laser apparatus. The laser apparatus of FIG. 4 is similar to the apparatus of FIG. 2, comprising a tapered diode laser 10, a non-linear crystal 12, mirrors 203 and 209, lens 206 and spatial filter 207, beam splitter 215, and detectors 208, 212, and 218, respectively, all as described in connection with FIG. 2.

The laser apparatus of FIG. 4 further comprises two lenses 424 and 425 configured to collimate the light emitted by the diode laser 10 as the light emitted from the tapered diode laser is astigmatic meaning that the focus positions for the horizontal and vertical axes are different. The light is then passed through an optical isolator 426 in order to avoid undesired feedback to the tapered diode laser which might otherwise destabilize the wavelength and/or impose damage to the laser. The lenses 424 and 425 and the optical isolator 426 are positioned in the beam path between the laser diode 10 and the first mirror 203. The apparatus further comprises a lens 428 configured to focus the light from the diode laser 10 into the nonlinear crystal 12. In the embodiment of FIG. 4, the lens 428 is positioned in the beam path between mirror 209 and the nonlinear crystal 12. The apparatus further comprises a lens 427 adapted to collimate the frequency-converted light from the nonlinear crystal 12. In the embodiment of FIG. 4, the lens 427 is positioned in the beam path between filter 214 and beam splitter 215.

In the following, various alternative embodiments of a laser apparatus will be described. As these embodiments have many general features in common, these will not be described in detail again.

Figure 5:
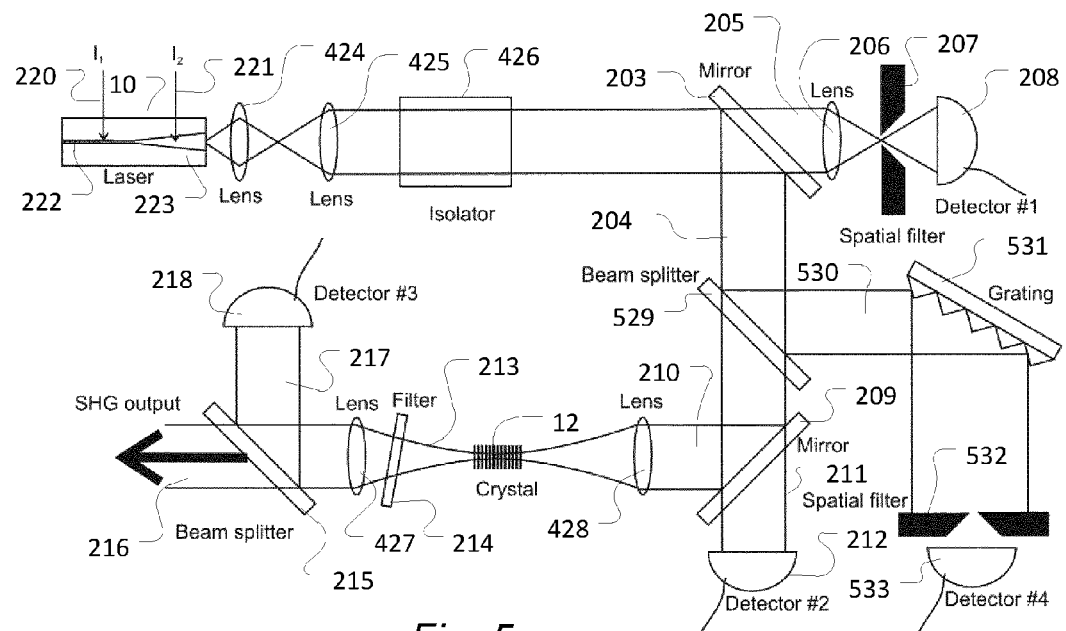

FIG. 5 shows a schematic illustration of another embodiment of a laser apparatus. The laser apparatus of FIG. 5 is similar to the apparatus of FIG. 4, but comprises an additional detector 533 for measuring the power content at a predetermined wavelength or range of wavelengths of the output beam from the laser diode 10. To this end, the apparatus comprises a beam splitter 529 with low reflectivity adapted to separate a diagnostic beam 530 from the main output beam of the laser diode. In the embodiment of FIG. 5, the beam splitter is positioned in the beam path between mirrors 203 and 209. However, it will be appreciated that the diagnostic beam may alternatively be picked up upstream from mirror 203 or downstream from mirror 209, or at another suitable position. The apparatus further comprises a grating 531 and a spatial filter 532 positioned in the diagnostic beam path 530 so as to cause the diagnostic beam to impinge on the grating 531 which redirects the beam towards the spatial filter, such that the spatial filter selects a portion of the diagnostic beam corresponding to a predetermined wavelength or wavelength range. The detector 533 is positioned downstream from the spatial filter 532 and is adapted to detect the beam power that has passed the spatial filter. The grating may be replaced by another dispersive element like e.g. a prism.

Hence, detector 533, e.g. a photodiode, may be used to monitor the power content at the wavelength or in the wavelength range selected by the grating and the spatial filter. Based on the monitored wavelength-specific power, a control unit may adjust the temperature of the diode laser 10 so as to optimize the power on detector 533 and thus to get the desired wavelength. For example, the control process of FIG. 3 may be modified such that the process initially determines an initial value of the temperature $T_l$ of the diode laser that at least approximately maximises the power at the desired wavelength. Subsequently, the process may perform a determination of a suitable setting of the two injection currents, as described in connection with FIG. 3. During subsequent operation detector 533 may be used to monitor fluctuations in the wavelength-specific power which may trigger a re-adjustment of the laser settings.

Figure 6:
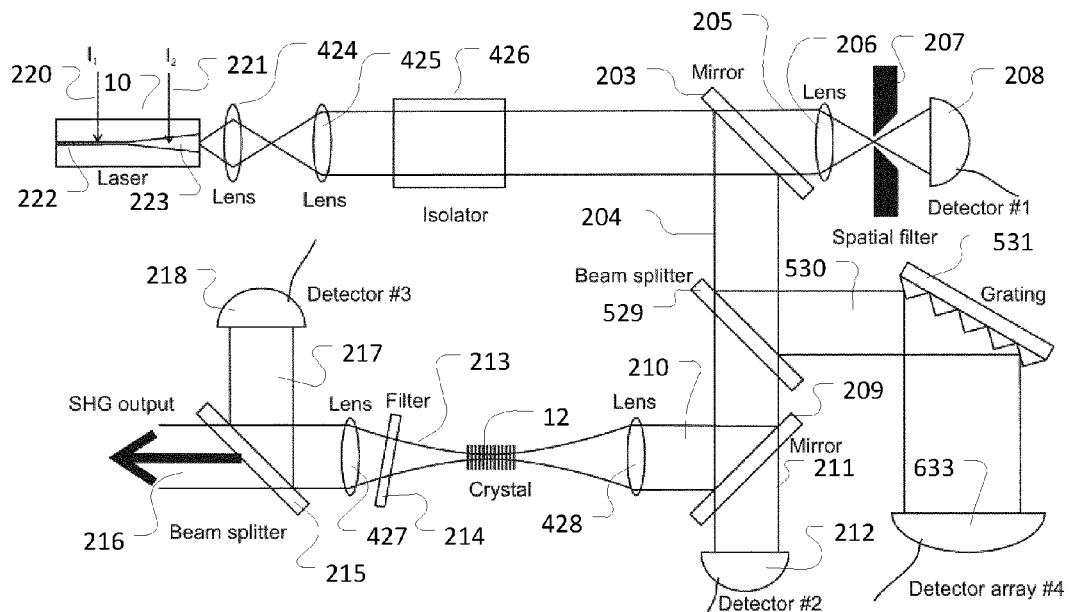

FIG. 6 shows a schematic illustration of another embodiment of a laser apparatus. The apparatus of FIG. 6 is similar to the apparatus of FIG. 5, but with the spatial filter and detector replaced by a detector array 633 allowing a monitoring of the power at different angles from the grating 531 or other dispersive element which will correspond to different wavelengths. As in the embodiment of FIG. 5, this embodiment allows adjustment of the laser temperature so as to optimize the power measured by the detector array 633 at the desired wavelength.

Figure 7:
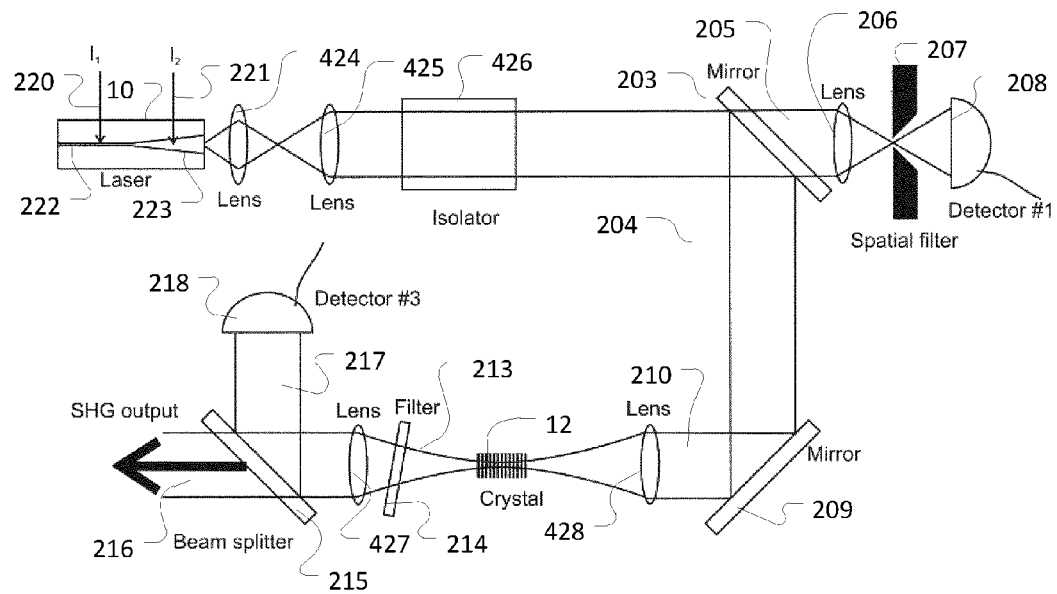

FIG. 7 shows a schematic illustration of another embodiment of a laser apparatus. The laser apparatus of FIG. 7 is similar to the apparatus of FIG. 4, but where the detector 212 has been omitted. Detector 208 may thus be used to reach a predetermined power in the central lobe. The current to the taper section 221 is set to a predetermined level and the ridge current 220 is adjusted to optimize the power in the central lobe. If the desired power in the central lobe is not reached, the current to the taper section is increased until the desired central lobe power is reached. This embodiment thus results in a simpler construction and control process at the prize of not always maximizing the percentage of power in the central lobe relative to the total power.

Figure 8:
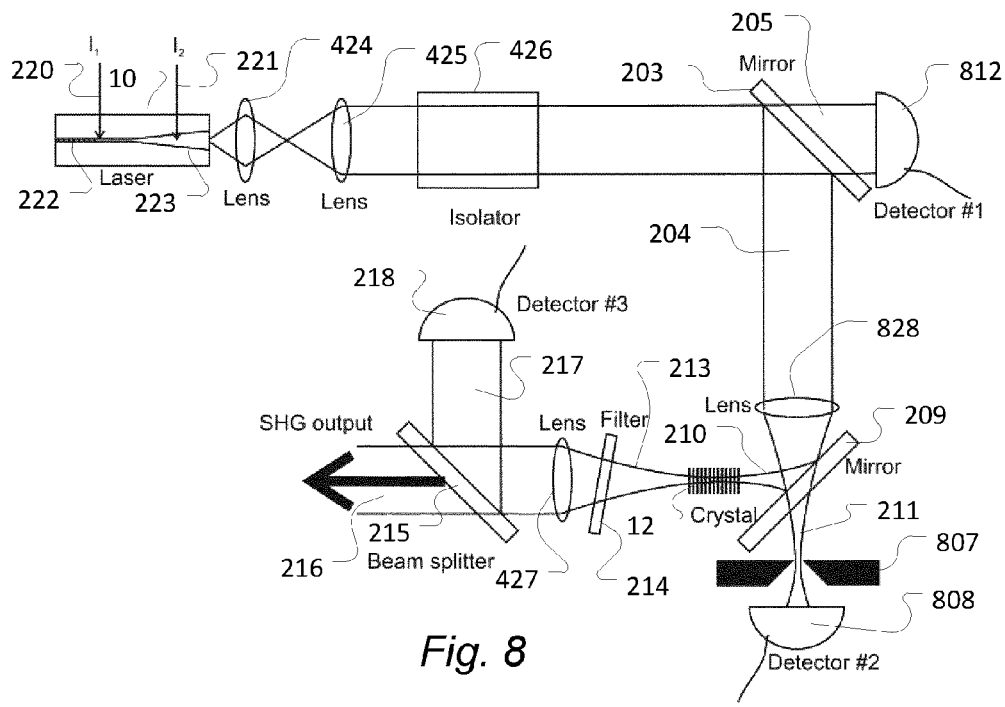

FIG. 8 shows a schematic illustration of another embodiment of a laser apparatus. The laser apparatus of FIG. 8 is similar to the apparatus of FIG. 4, but where the positions of the detectors for detecting the total power and the power content of the central lobe are interchanged. To this end, the lens 828 used to focus the beam into the nonlinear crystal 12 is placed between the two mirrors 203 and 209 so as to generate a focus in the nonlinear crystal 12 as well as behind the second bend mirror 209. The spatial filter 807 is placed in the focus behind the second bend mirror 209, and the power in the central lobe is measured by detector 808 placed behind spatial filter 807. Detector 812 is placed behind the first bend mirror 203 to measure the total power of the output beam from laser diode 10.

Figure 9:
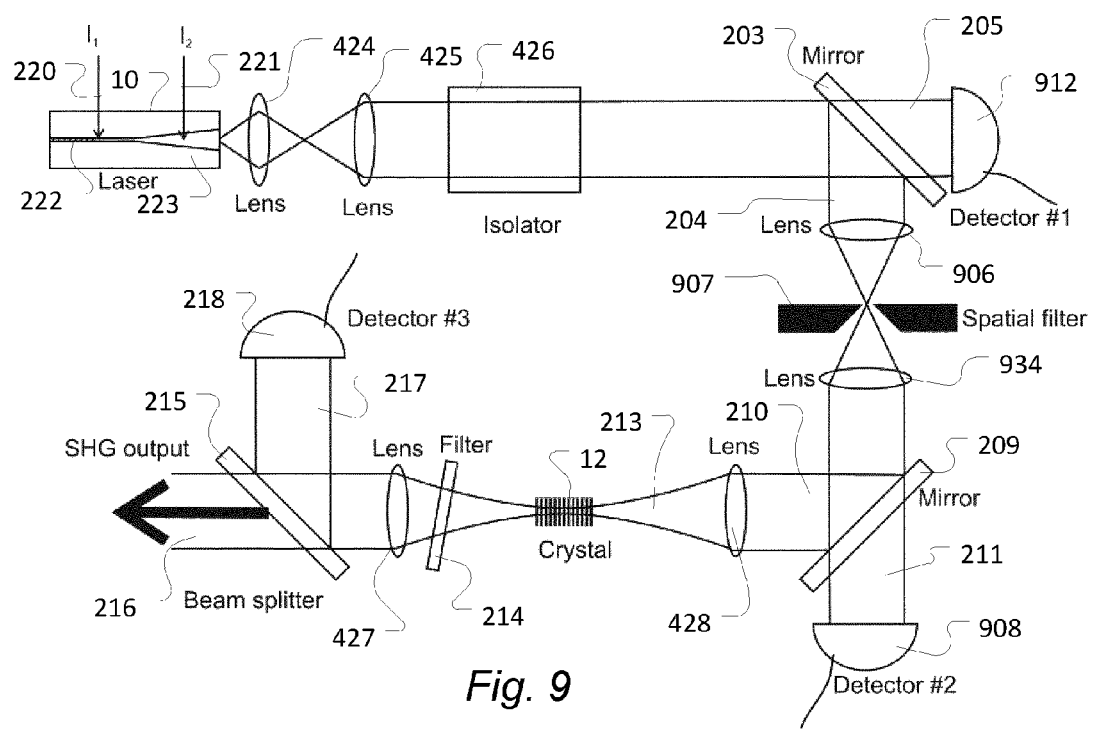

FIG. 9 shows a schematic illustration of another embodiment of a laser apparatus. The laser apparatus of FIG. 9 is similar to the apparatus of FIG. 8, but where the spatial filter 907 is placed in the beam path between the two bend mirrors 203 and 209. Focussing lens 906 is placed in front of the spatial filter, and collimating lens 934 behind the spatial filter. As in the embodiment of FIG. 8, detector 908 for monitoring the power in the central lobe is positioned behind the second bend mirror 209, while detector 912 for monitoring the total beam power of the output from the diode laser is positioned behind the first bend mirror 203.

Figure 10:
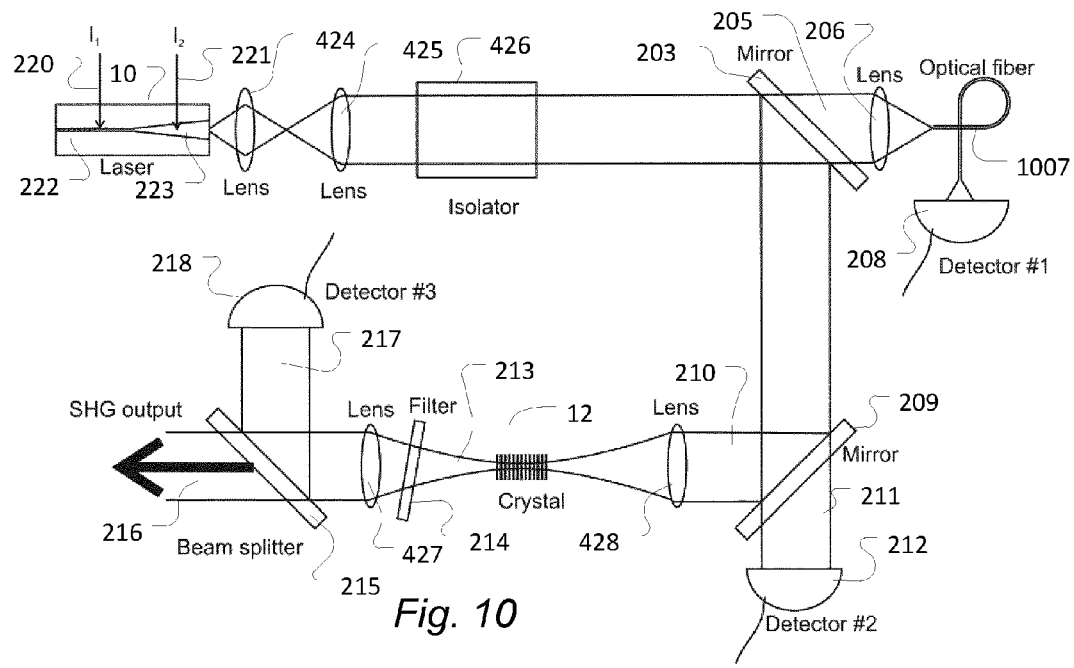
Figure 11:
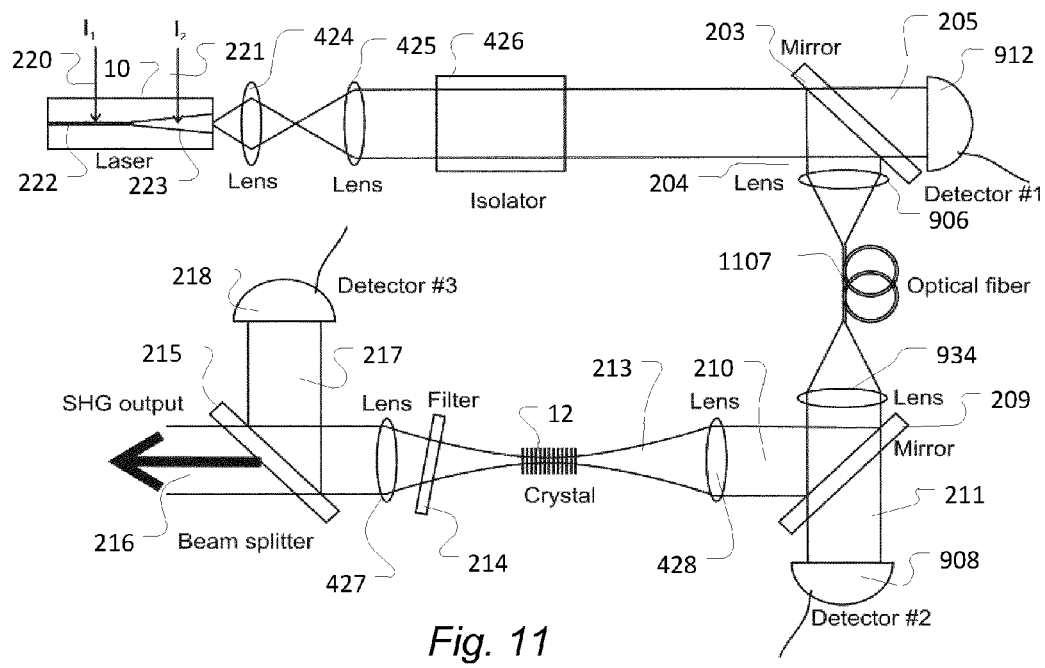

FIGS. 10 and 11 show schematic illustrations of further embodiments of a laser apparatus. The laser apparatus of FIG. 10 is similar to the apparatus of FIG. 4, but where the spatial filter 207 in the form of a slit is replaced by an optical fiber 1007 functioning as a spatial filter. Similarly, the laser apparatus of FIG. 11 is similar to the apparatus of FIG. 9, but where the spatial filter 907 in the form of a slit is replaced by an optical fiber 1107 functioning as a spatial filter. In these embodiments, the optical fibers may be of the single-mode or the multi-mode type. In the embodiment of FIG. 11 where the optical fiber is positioned in the main beam path, a single-mode fiber is preferred.

Figure 12:
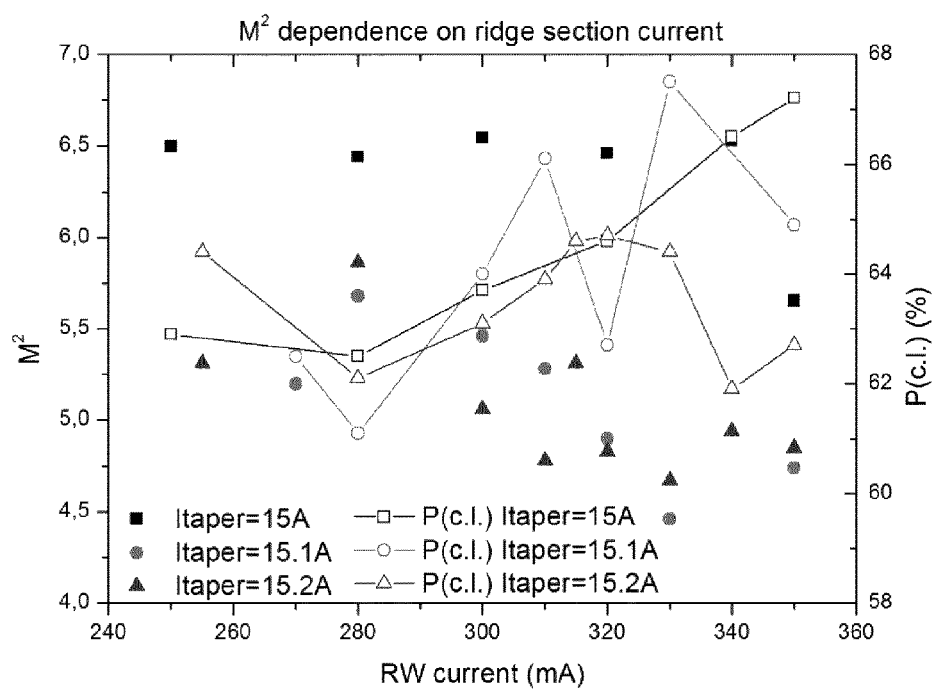
FIG. 12 illustrates the relation between $M^2$, the power content of the central lobe and the ridge and tapered currents of a specific tapered laser diode.

FIG. 12 illustrates the relation between $M^2$, the power content of the central lobe and the ridge and tapered currents of a specific tapered laser diode. In particular, the unconnected symbols illustrate measured $M^2$ values as a function of the ridge waveguide current of a tapered laser diode. Different symbols relate to different values of the taper current. As is apparent from FIG. 12, the behaviour of the beam quality parameter $M^2$ as a function of ridge current is very sensitive to the taper current. In the present example, for a taper current of 15 A, the $M^2$ value is relatively constant over a wide range of ridge currents and experiences a sharp drop when the ridge current exceeds 340 mA. However, when the taper current is increased only slightly up or down the dependence differs considerably. For taper currents of 15.1 A and 15.2 A, the $M^2$ value shows a minimum at a ridge current of around 330 mA. Hence, the dependence of the $M^2$ factor on the two currents is rather complicated and a simple increase of the ridge current as suggested in the prior art is not guaranteed to result in the optimal value, or in a stable operation of the laser.

The symbols connected by lines illustrate measured power contents of the central lobe $P_{cl}$ relative to the total power as a function of ridge current. Again different symbols correspond to different values of the taper current. Also these measurements illustrate a different dependence of the total power content on the ridge current for different values of the taper current. As for the $M^2$ measurements, the relation between the power content in the central lobe to the ridge current is complicated. Nevertheless, the inventors have realised that a control process optimizing the currents and the temperature so as to identify an optimum power content in the central lobe while at the same time providing a high total power (e.g. larger than a threshold value) and a small fluctuation of the power content in the central lobe (e.g. smaller than a predetermined threshold value) allows identification of an optimal or at least close to optimal setting of the control parameters of a diode laser in the context of frequency conversion. At the same time such a control process results in a highly stable laser output.

FIG. 12 further illustrates that the maximum values of the power content in the central lobe do not always coincide with the location of the minimum of the corresponding $M^2$ measurements. For example, for $I_r$=15.2 A, the optimal $M^2$ value occurs at $I_{RW}$=330 mA, while the optimum power content of the central lobe $P_{cl}$ occurs at $I_{RW}$=320 mA. However, as explained above, in the context of frequency conversion, it has turned out that optimizing the power content of the central lobe provides a further improvement of the beam properties of the resulting frequency converted beam. Furthermore, measurement of the power content of a dominant mode of a laser beam requires a less complex sensor arrangement as e.g. an $M^2$ measurement.

Figure 13:
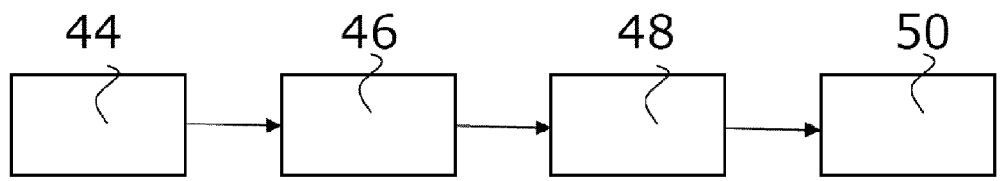
FIG. 13 is a schematic illustration of steps of a first method.

FIG. 13 is a schematic block diagram illustrating steps of a method of optically pumping a target laser in a laser system, the laser system comprising a laser source providing radiation at a first frequency, the laser source being optically connected to an input of a frequency converter, the frequency converter configured to convert the radiation at the first frequency to a second, different frequency, the target laser arranged in optical communication with an output of the frequency converter, the method comprising the steps of emitting 44 radiation from the laser source, receiving 46 the radiation at the frequency converter, converting 48 the radiation from the first frequency to the second frequency in the frequency converter, providing 50 the radiation at the second frequency at the target laser so that the target laser is optically pumped.

The method may further include the second frequency being within the absorption band of the target laser. This is advantageous in that as much radiation as possible may be absorbed in the target laser. The second frequency may overlap less than 100% with the absorption band of the target laser. In an embodiment the target laser is a Ti:sapphire laser.

FIGS. 14 and 15 show a series of measurements of the beam profile in the focus region for a specific tapered diode laser at fixed taper section currents and varying ridge section currents. As seen in the figures, the power content in the side lobes is dependent on the injection current to the ridge section and thus it is possible to increase the power content in the main/central lobe by adjusting the currents so as to minimize the power content in the side lobes. As opposed to prior art findings, the optimum injection current setting is not found by maximizing the injection current to the ridge section.

In the following, further embodiments of laser apparatus will be described that benefit from embodiments of the control method disclosed herein. In general, in some embodiments, the frequency conversion unit is arranged to receive a further laser beam, e.g. from a further laser source or a resonant cavity. The benefits of using an embodiment of the control method disclosed herein with such embodiments include that the central/main lobe power is optimized and the frequency conversion (SFG, DFG or the like) will be more efficient and more power will be generated.

Figure 16:
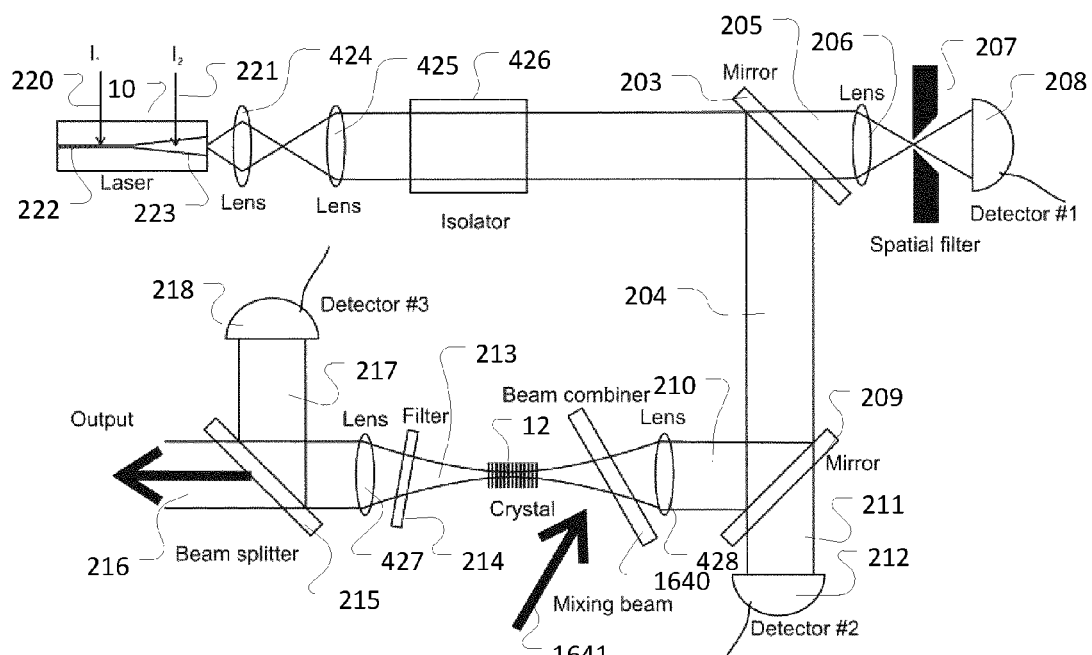
FIG. 16-19 show schematic illustrations of further embodiments of a laser apparatus.

FIG. 16 shows a schematic illustration of another embodiment of a laser apparatus. The laser apparatus of FIG. 16 is similar to the apparatus of FIG. 4, but where a beam combiner 1640 is placed in the beam path between the bend mirror 209 and the frequency converting crystal 12. The beam combiner may be a dichroic mirror, a diffraction grating, a prism or the like that primarily transmits the beam 210 and reflects the mixing beam 1641. The mixing beam 1641 may come from a DPSS laser, an OPS laser, a fiber laser, a diode laser or the like. The nonlinear crystal 12 is positioned in an overlapping region of the two incoming beams 210 and 1641. The nonlinear crystal may generate a beam 216 with the sum frequency and/or the difference frequency and/or the second harmonic frequency of the two incoming beams 210 and 1641.

Figure 17:
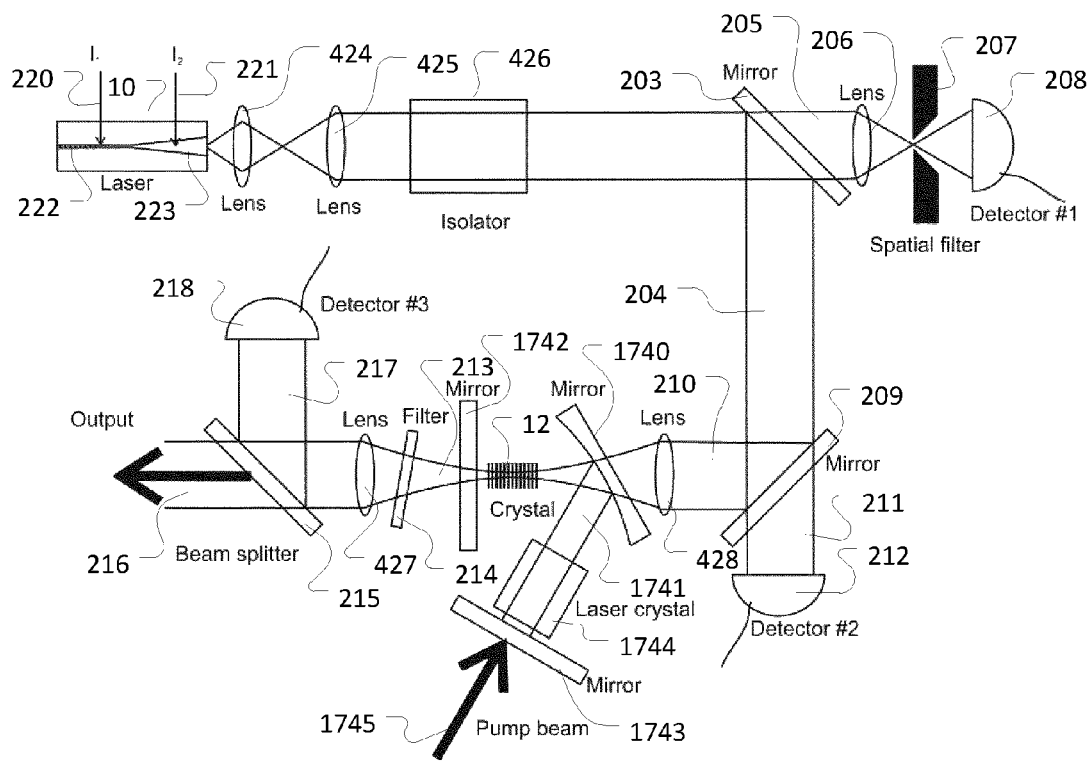

FIG. 17 shows a schematic illustration of another embodiment of a laser apparatus. The laser apparatus of FIG. 17 is similar to the apparatus of FIG. 4, but where the nonlinear crystal 12 is placed inside the cavity of another laser. This other laser may be a DPSS laser, an OPS laser or the like. The three mirrors 1742, 1740 and 1743 constitute a laser cavity. The laser beam 1741 oscillates in the cavity and has an overlapping region with beam 210 inside the nonlinear crystal. The mirror 1740 is positioned in the beam path between lens 428 and the nonlinear crystal 12 and is primarily transparent to the incoming beam 210 and reflecting for the resonant laser beam 1741. The mirror 1742 is positioned in the beam path between the nonlinear crystal 12 and the filter 214 and is preferably reflecting to the resonant beam 1741 and transparent for the beam 210 and the generated beam 213. The nonlinear crystal 12 may generate a beam with the sum frequency and/or the difference frequency and/or the second harmonic frequency of the two incoming beams 210 and 1741. A laser crystal 1744 may be positioned inside the resonant cavity consisting of mirrors 1742, 1740, and 1743. The laser crystal 1744 may be pumped by a pump beam 1745 from an external pump laser (not explicitly shown). The resonant laser cavity is shown as a linear standing wave cavity but may take the form of a uni-directional ring cavity or any other suitable form.

Figure 18:
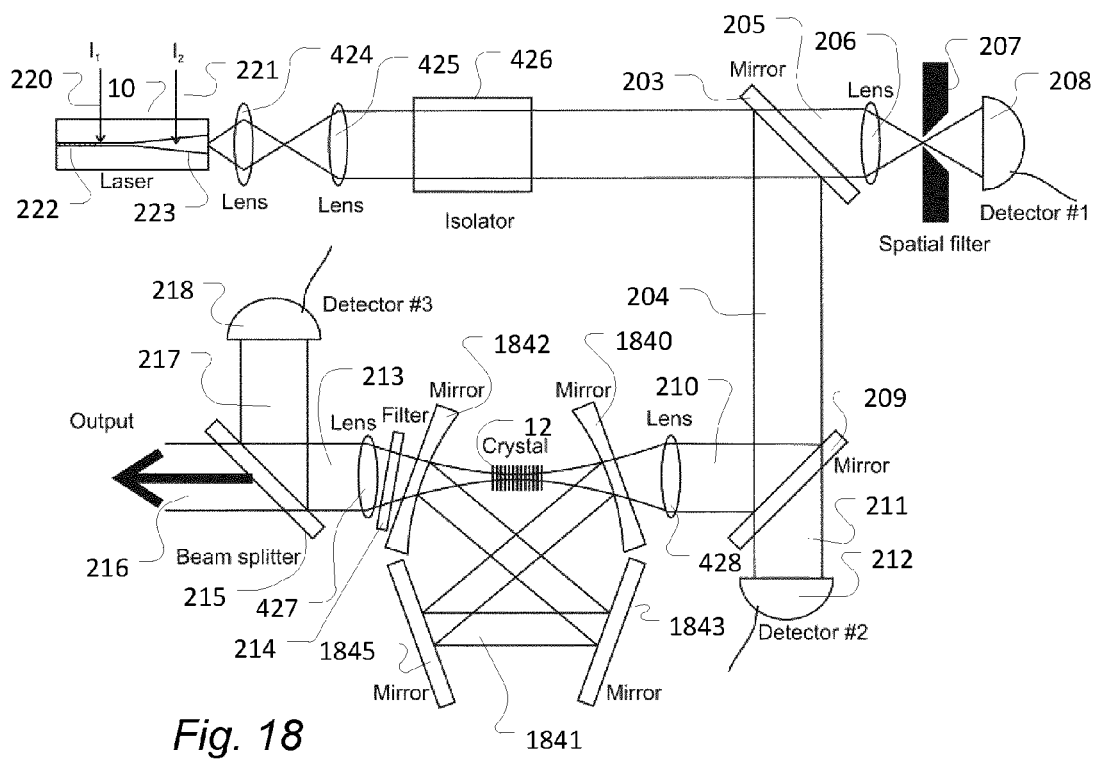

FIG. 18 shows a schematic illustration of another embodiment of a laser apparatus. The laser apparatus of FIG. 18 is similar to the apparatus of FIG. 4, but where the nonlinear crystal 12 is placed inside a cavity in order to make the device operate as an optical parametric oscillator (OPO). The cavity is formed by mirrors 1842, 1840, 1843, and 1845. These mirrors are preferably all reflecting at a chosen first wavelength or first wavelength interval longer than the wavelength of laser 10. Two of the mirrors (1840 and 1842) are placed in the beam path of the beam 210 from the laser diode 10. Mirror 1840 is placed upstream of the nonlinear crystal, while mirror 1842 is placed downstream from the nonlinear crystal. The mirror 1840 is preferably primarily transparent to the incoming beam 210. The mirror 1842 is preferably transparent to a second wavelength interval at wavelengths longer than the wavelength of laser 10. The mirror 1842 may be transparent or reflecting for the wavelength of laser 10. Depending on the reflectivity of mirror 1842, the filter 214 may be omitted. Mechanisms for maintaining a predetermined total length between mirrors 1842, 1840, 1843, and 1845 may be incorporated. The nonlinear crystal 12 may incorporate several possibilities for obtaining phase matching. It may be a periodically poled crystal with several different poling periods. It may consist of two or more crystals chosen to operate as OPO crystal and/or SFG crystal and/or DFG crystal and/or SHG crystal. It may be a periodically poled crystal with two or more poling periods in series so as to perform SHG and/or SFG and/or DFG between any of the beams present in the nonlinear crystal 12, i.e. the incoming beam 210, the oscillating beam 1841 in the OPO cavity, the generated beam escaping the OPO cavity 213 or any other beam present in the nonlinear crystal. The cavity for the OPO is shown as four mirror ring cavity but may take the form of a linear cavity or any other suitable form.

Figure 19:
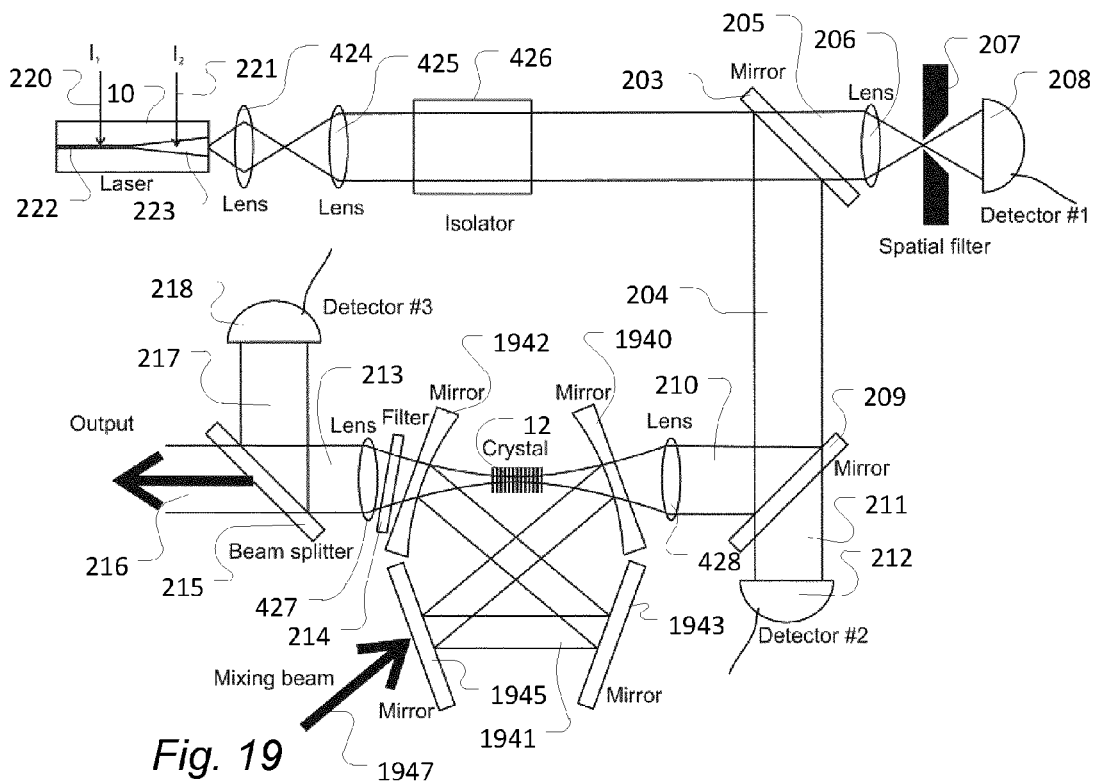

FIG. 19 shows a schematic illustration of another embodiment of a laser apparatus. The laser apparatus of FIG. 19 is similar to the apparatus of FIG. 4, but where the nonlinear crystal 12 is placed inside a cavity in order to take advantage of the high circulating power inside a resonant cavity. The mirrors 1942, 1940, 1943, and 1945 are preferably all reflecting at a chosen first wavelength or first wavelength interval different from the wavelength of laser 10. Two of the mirrors (1940 and 1942) are placed in the beam path of the beam 210 from the laser diode 10 Mirror 1940 is placed upstream of the nonlinear crystal, while mirror 1942 is placed downstream from the nonlinear crystal. The mirror 1940 is preferably primarily transparent to the incoming beam 210. The mirror 1942 may be transparent or reflecting for the wavelength of laser 10. Depending on the reflectivity of mirror 1942, the filter 214 may be omitted. Mechanisms for maintaining a predetermined total length between mirrors 1942, 1940, 1943, and 1945 may be incorporated. An incoming beam 1947 is at least partially coupled into the resonant cavity consisting of the mirrors 1942, 1940, 1943, and 1945. The nonlinear crystal 12 may be chosen so as to phase match SFG and/or DFG and/or SHG between the incoming beam 210 and the resonant beam 1941. In a slightly different embodiment, the mixing beam is left out. The mirrors 1942, 1940, 1943, and 1945 are then chosen to couple the incoming beam 210 into the resonator and resonating the beam inside the resonator. The nonlinear crystal is chosen so as to frequency-double the light in the beam 210. The efficiency of the frequency doubling will be enhanced compared to the example in FIG. 4 due to the high circulating power in the resonator. The resonant cavity is shown as four mirror ring cavity but may take the form of a linear cavity or any other suitable form.

Although the present invention has been described in connection with the specified embodiments, it should not be construed as being in any way limited to the presented examples. The scope of the present invention is to be interpreted in the light of the accompanying claim set. In particular, embodiments of the invention have mainly been described in the context of pumping a target laser. However, embodiments of the invention described herein may be used in other applications such as in an apparatus for medical treatment, diagnostics or spectroscopy. For therapeutic purposes it has been found that light in the yellow spectral region and/or green spectral region are especially advantageous. For example laser apparatus as described herein may be used in an apparatus for treating vascular diseases and/or eye diseases. Alternatively, embodiments of the invention described herein may be used for fluorescence diagnostics. Alternatively, embodiments of the invention described herein may be used for spectroscopy. For example, the signal from a NIR diode laser source as described herein may be frequency converted before travelling through a sample and being detected at the detector. In an embodiment the apparatus emits light in the blue and/or ultraviolet spectral region. This may be especially useful for special applications, such as the applications mention throughout this description. In an embodiment the apparatus is used for flow cytometry. In an embodiment the apparatus is used for display applications.

The individual elements of an embodiment of the invention may be physically, functionally and logically implemented in any suitable way such as in a single unit, in a plurality of units or as part of separate functional units. The invention may be implemented in a single unit, or be both physically and functionally distributed between different units and processors.

In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method of controlling beam quality and stability of a laser apparatus, the laser apparatus comprising:
   a tapered diode laser providing first radiation of at least a first wavelength, the first radiation having a multi-lobe spatial intensity distribution with a dominant lobe and lower-power side lobes; the diode laser comprising at least a ridge waveguide and a tapered section, a first contact for injecting a first current into the ridge waveguide, a second contact for injecting a second current into the tapered section, and means for controlling a temperature of the diode laser; and
   a frequency conversion unit configured to frequency-convert the first radiation from the diode laser and to output the frequency-converted radiation, the frequency-converted radiation having at least a second wavelength different from the first wavelength,
   wherein the method comprises:
      monitoring the power content of the dominant lobe of the first radiation and monitoring a second parameter indicative of a total power of the first radiation;
      iteratively determining a combination of respective values of the first current, the second current and the temperature at which combination of respective values the monitored second parameter is equal to or larger than a first threshold, the monitored power content of the dominant lobe is equal to or larger than a second threshold, and a stability parameter indicative of a fluctuation over time of the monitored power content of the dominant lobe is below a third threshold;
      setting the first current, the second current, and the temperature to the determined combination of respective values;
      adjusting the first current so as to at least approximately maximise the monitored power content of the dominant lobe, and adjusting the second current until the second parameter is equal or larger than said first threshold;
      if the determined stability parameter exceeds said third threshold, determining whether the second current is below a predetermined threshold current;

if the second current is above said predetermined threshold current, adjusting the temperature to a modified temperature setting; otherwise modifying the first threshold; and adjusting the first current and the second current until the power content of the dominant lobe is equal to or larger than the second threshold and the second parameter is equal to or larger than said first threshold.

2. A method according to claim 1, comprising:

determining a dominant lobe power content of the first radiation;

comparing the determined dominant lobe power content to the first threshold, if the determined dominant lobe power content is below the first threshold, adjusting the first current until the dominant lobe power content is above the first threshold;

if the determined dominant lobe power content is below the second threshold and if the first current is at a lowest or highest current threshold, adjusting the second current.

3. A method according to claim 1, comprising:

determining a noise level of the first radiation;

comparing the determined noise level to the third threshold;

if the determined noise level is above the third threshold, adjusting at least one of the first and second currents and/or the temperature of the diode laser until the noise level is below the third threshold.

4. A method according to claim 1, wherein determining the combination of respective values comprises:

a) setting the temperature to an initial value;
b) monitoring the second parameter and adjusting the second current until the second parameter is equal or larger than the first threshold;
c) monitoring the power content of the dominant lobe and adjusting the first current so as to increase the power content of the dominant lobe;
d) comparing the power content of the dominant lobe with the second threshold;
e) if the power content of the dominant lobe is smaller than the second threshold, comparing the second current with a threshold current;
   if the second current is smaller than the threshold current increasing the first threshold and repeating steps b) through d); otherwise
   decreasing the temperature and repeating steps b) through d);
f) if the power content of the dominant lobe is larger than the second threshold, monitoring the power content of the dominant lobe and determine a level of fluctuation of the power content of the dominant lobe over time; and if the determined fluctuation is larger than the third threshold, repeating step e).

5. A method according to claim 1, further comprising monitoring a third parameter indicative of a power of the first radiation within a predetermined wavelength interval; and wherein determining a combination of respective values of the first current, the second current and the temperature comprises determining a combination of respective values of the first current, the second current and the temperature at which combination of respective values the monitored power content of the dominant lobe, the monitored second parameter, the monitored third parameter, and a fluctuation over time of the monitored power content of the dominant lobe each fulfils a respective predetermined optimization criterion.

6. A method according to claim 1, comprising measuring the power of the frequency-converted radiation, and adjusting the temperature of the frequency-converter unit until the measured power of the frequency-converted radiation is maximised or above a predetermined threshold.

7. A method according to claim 1, wherein the diode laser is adapted to provide radiation in a single-frequency output.

8. A method according to claim 1, wherein the frequency conversion unit includes a non-linear optical material.

9. A method according to claim 1, wherein the frequency conversion unit is adapted to double the frequency of the radiation from the diode laser.

10. A method according to claim 1, further comprising providing the frequency-converted radiation to a target laser so that the target laser is optically pumped.

11. A laser apparatus comprising:

a tapered diode laser providing first radiation of at least a first wavelength, the first radiation having a multi-lobe spatial intensity distribution with a dominant lobe and lower-power side lobes, the diode laser comprising a ridge waveguide and a tapered section, a first contact for injecting a first current into the ridge waveguide, a second contact for injecting a second current into the tapered section, and means for controlling a temperature of the diode laser; and a frequency conversion unit configured to frequency-convert the radiation from the diode laser and to output the frequency-converted radiation, the frequency-converted radiation having at least a second wavelength different from the first wavelength;

a first sensor configured to measure the power content of the dominant lobe of the first radiation;

a second sensor configured to measure a second parameter indicative of a total power of the first radiation;

a control circuit configured to determine a combination of respective values of the first current, the second current and the temperature at which combination of respective values the second parameter is equal to or larger than a first threshold, the monitored power content of the dominant lobe is equal to or larger than a second threshold, and a stability parameter indicative of a fluctuation over time of the monitored power content of the dominant lobe is below a third threshold; and to set the first current, the second current, and the temperature to the determined combination of respective values wherein the control circuit is further configured to adjust the first current so as to at least approximately maximise the monitored power content of the dominant lobe, and to adjust the second current until the second parameter is equal or larger than said first threshold;

if the determined stability parameter exceeds the third threshold, to determine whether the second current is below a predetermined threshold current;

if the second current is above the predetermined threshold current, to adjust the temperature to a modified temperature setting; otherwise to modify the first threshold; and to adjust the first current and the second current until the power content of the dominant lobe is equal to or larger than the second threshold and the second parameter is equal to or larger than said first threshold.

12. A control device for a laser apparatus, the control device being configured to perform the steps of the method defined in claim 1.

\* \* \* \* \*